US008826198B2

(12) United States Patent
Tsai et al.

(10) Patent No.: US 8,826,198 B2
(45) Date of Patent: Sep. 2, 2014

(54) METHOD AND APPARATUS FOR ENHANCING SIGNAL STRENGTH FOR IMPROVED GENERATION AND PLACEMENT OF MODEL-BASED SUB-RESOLUTION ASSIST FEATURES (MB-SRAF)

(71) Applicant: ASML Netherlands B.V., Veldhoven (NL)

(72) Inventors: Min-Chun Tsai, San Jose, CA (US); Been-Der Chen, Milpitas, CA (US); Yen-Wen Lu, Los Altos, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/892,984

(22) Filed: May 13, 2013

(65) Prior Publication Data

US 2013/0311960 A1    Nov. 21, 2013

Related U.S. Application Data

(63) Continuation of application No. 13/007,358, filed on Jan. 14, 2011, now Pat. No. 8,443,312.

(60) Provisional application No. 61/295,100, filed on Jan. 14, 2010.

(51) Int. Cl.
*G06F 17/50* (2006.01)
(52) U.S. Cl.
USPC ................ 716/55; 716/50; 716/51; 716/52; 716/53; 716/54; 716/56

(58) Field of Classification Search
CPC ............ G06F 17/5068; G06F 17/5081; G03F 7/70441; G03F 1/144; G03F 1/36
USPC ...................................... 716/50–56
See application file for complete search history.

(56) References Cited

U.S. PATENT DOCUMENTS 7,124,395 B2   10/2006   Shi et al.
7,355,673 B2    4/2008   Hsu et al.
(Continued)

FOREIGN PATENT DOCUMENTS

JP    2003-303742    10/2003
JP    2003-322945    11/2003
(Continued)

OTHER PUBLICATIONS

Japanese Office Action mailed Oct. 30, 2012 in corresponding Japanese Patent Application No. 2011-002116.

*Primary Examiner* — Stacy Whitmore
(74) *Attorney, Agent, or Firm* — Pillsbury Winthrop Shaw Pittman LLP

(57) ABSTRACT

Model-Based Sub-Resolution Assist Feature (SRAF) generation process and apparatus are disclosed, in which an SRAF guidance map (SGM) is iteratively optimized to finally output an optimized set of SRAFs as a result of enhanced signal strength obtained by iterations involving SRAF polygons and SGM image. SRAFs generated in a prior round of iteration are incorporated in a mask layout to generate a subsequent set of SRAFs. The iterative process is terminated when a set of SRAF accommodates a desired process window or when a predefined process window criterion is satisfied. Various cost functions, representing various lithographic responses, may be predefined for the optimization process.

15 Claims, 24 Drawing Sheets

(56) References Cited

U.S. PATENT DOCUMENTS

| | | |
|---|---|---|
| 7,614,034 B2 | 11/2009 | Van Den Broeke et al. |
| 7,882,480 B2 | 2/2011 | Ye et al. |
| 2004/0139418 A1 | 7/2004 | Shi et al. |
| 2005/0028129 A1 | 2/2005 | Hsu et al. |
| 2008/0301620 A1 | 12/2008 | Ye et al. |
| 2010/0203430 A1* | 8/2010 | Ye et al. ............ 430/5 |

FOREIGN PATENT DOCUMENTS

| | | |
|---|---|---|
| JP | 2004-133426 | 4/2004 |
| JP | 2005-026701 | 1/2005 |
| JP | 2005-352365 | 12/2005 |
| JP | 2009-031320 | 2/2009 |
| JP | 2010-531463 | 9/2010 |
| WO | 2008/151185 | 12/2008 |

* cited by examiner

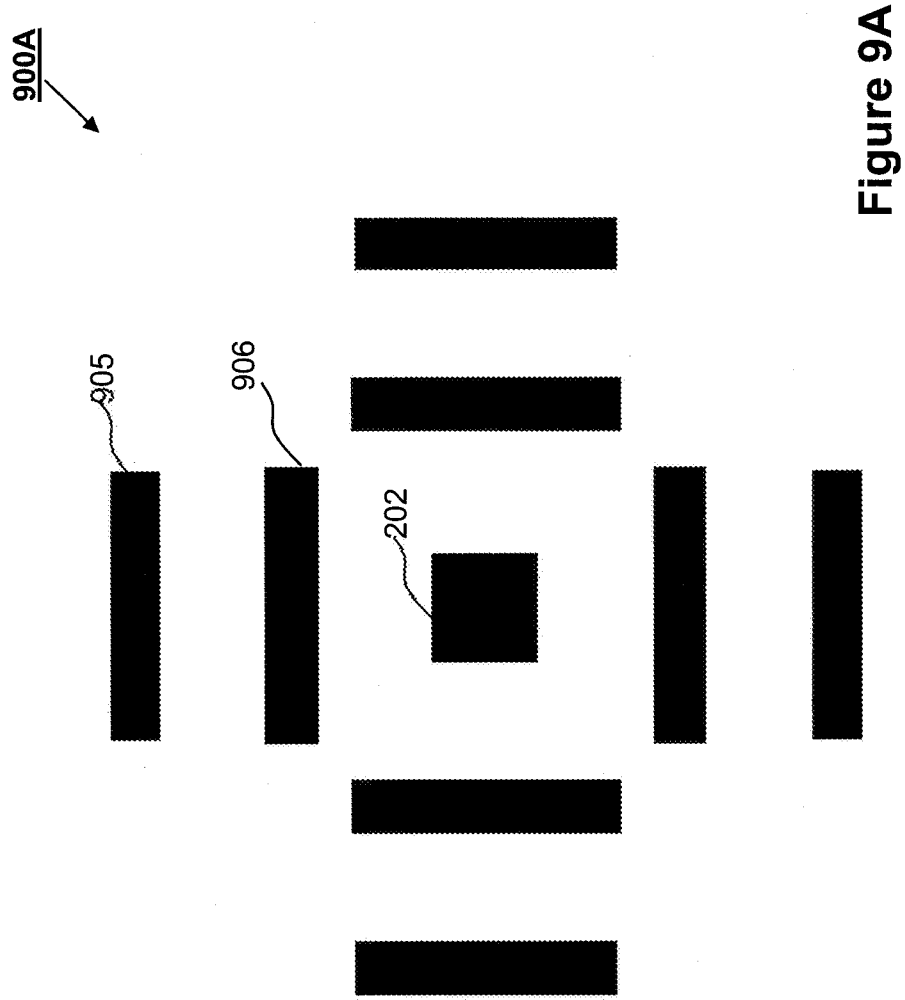

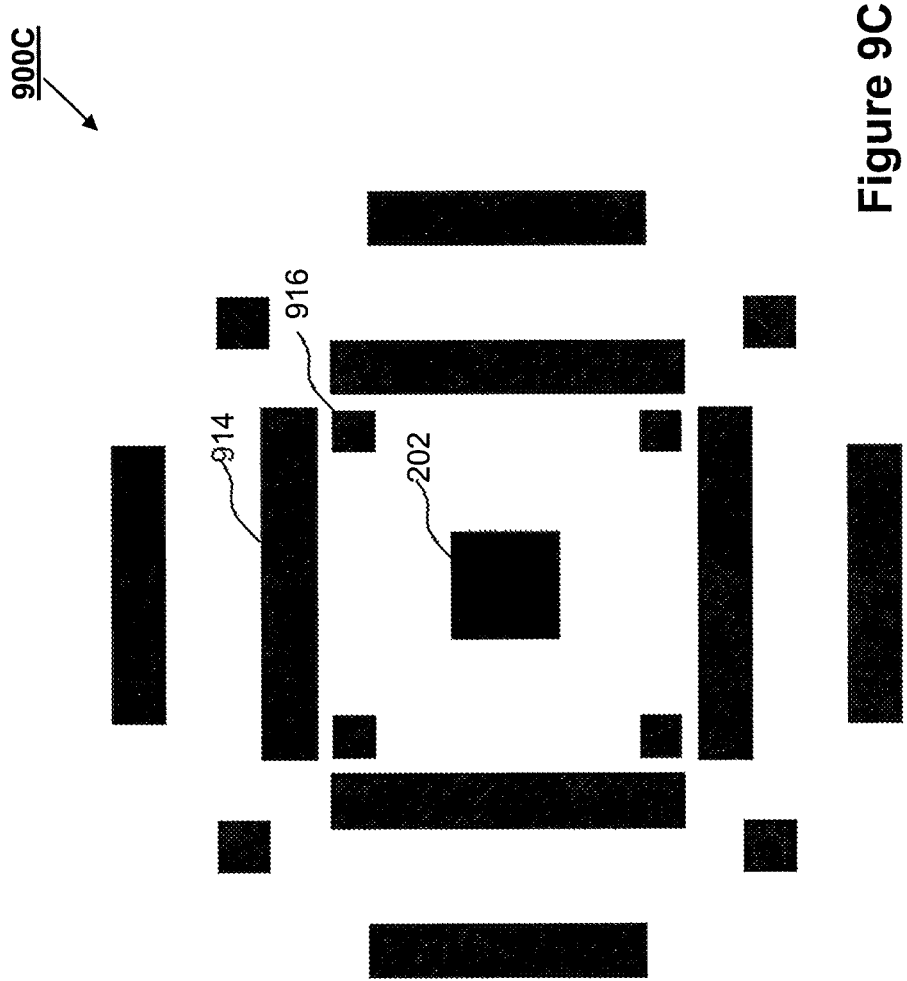

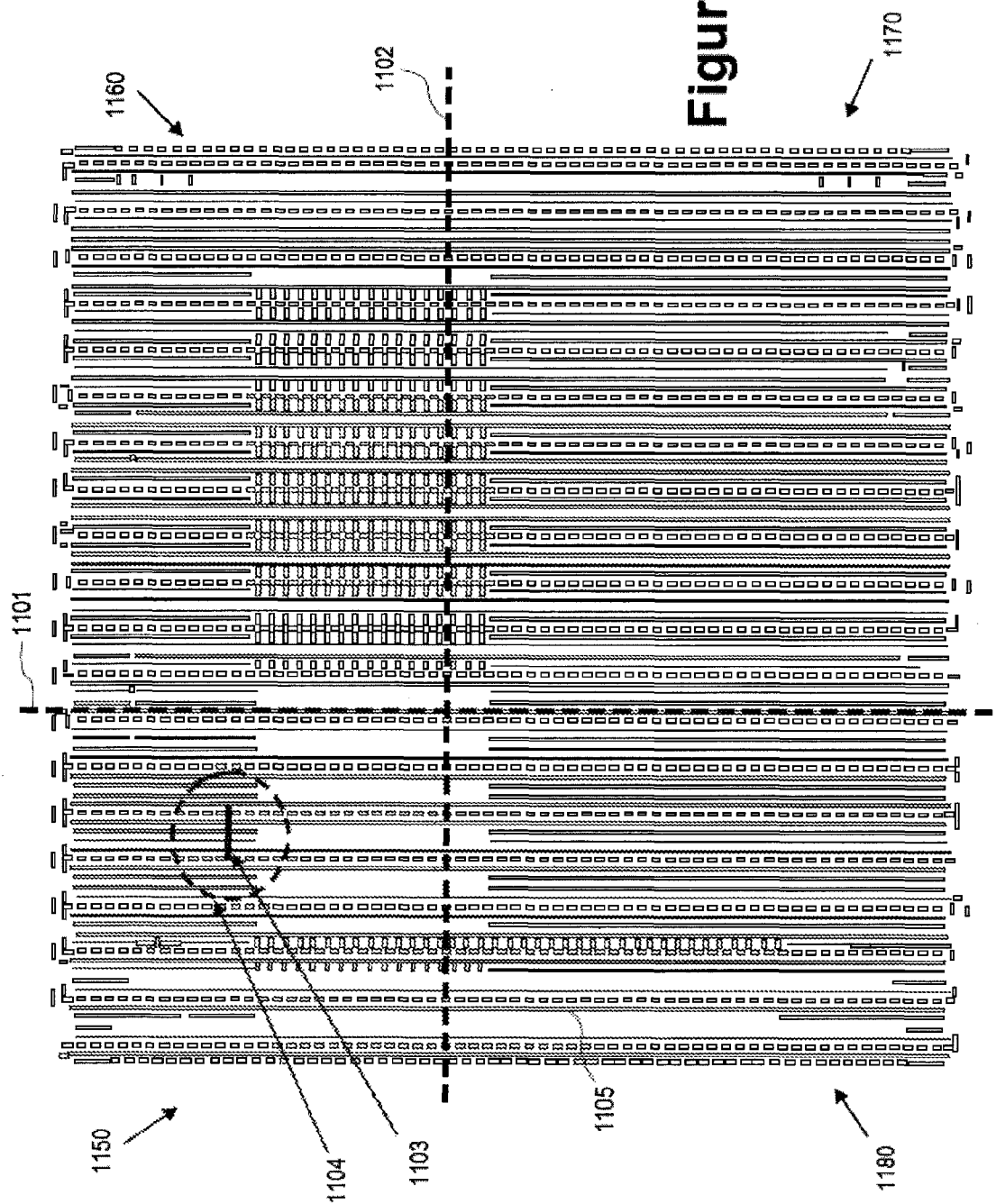

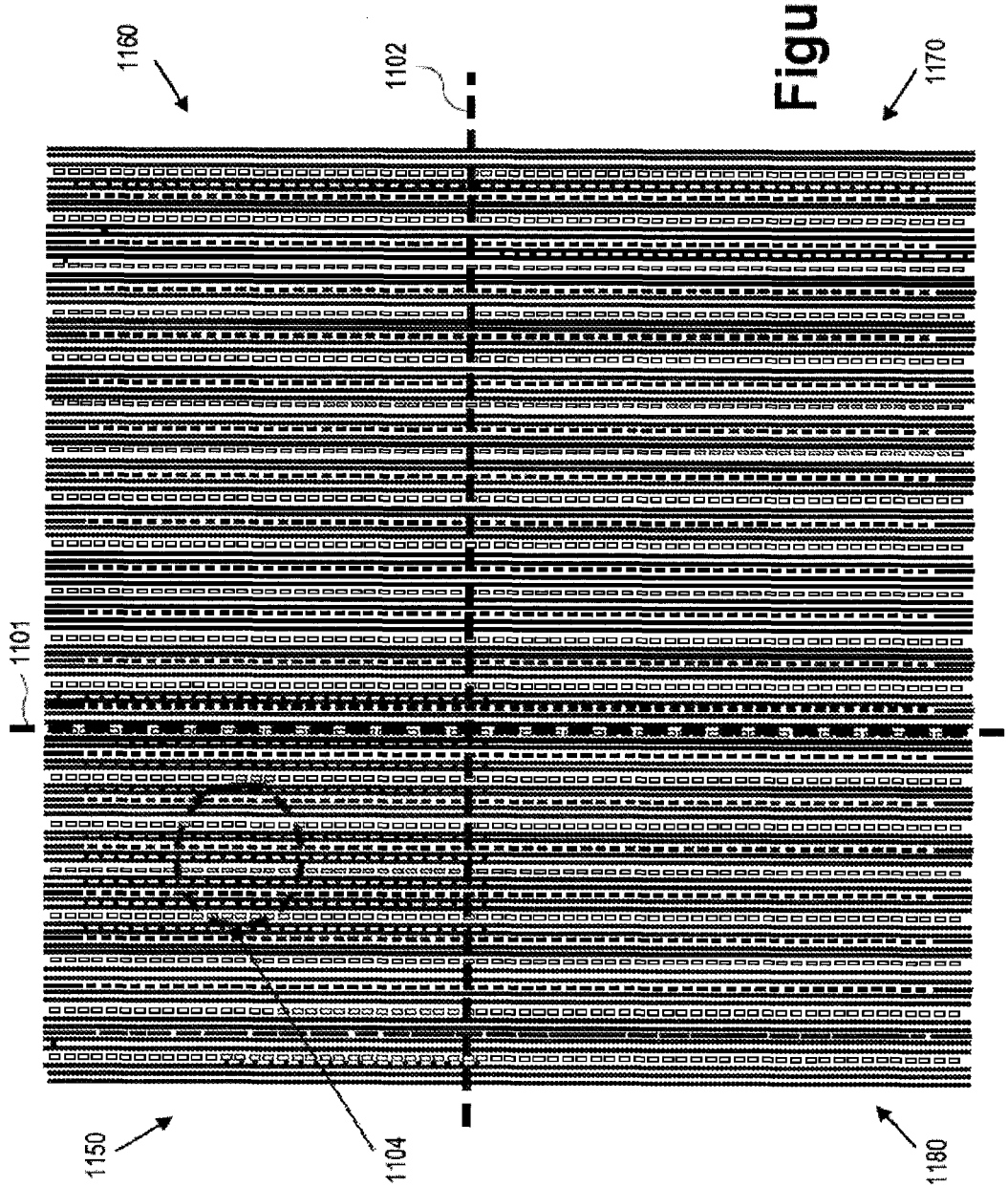

METHOD AND APPARATUS FOR ENHANCING SIGNAL STRENGTH FOR IMPROVED GENERATION AND PLACEMENT OF MODEL-BASED SUB-RESOLUTION ASSIST FEATURES (MB-SRAF)

CROSS-REFERENCE TO RELATED APPLICATIONS

This application is a Continuation of U.S. patent application Ser. No. 13/007,358 (Now U.S. Pat. No. 8,443,312), filed Jan. 14, 2011, which claims the benefit of U.S. Provisional Application Ser. No. 61/295,100, filed Jan. 14, 2010, all of which are incorporated herein by reference in their entirety.

FIELD

This invention relates generally to resolution enhancement techniques for photolithography and relates more particularly to a system and method for model-based sub-resolution assist feature generation and manipulation.

BACKGROUND

The integrated circuit industry has, since its inception, maintained a remarkable growth rate by driving increased device functionality at lower cost. One of the primary enabling factors of this growth has been the ability of optical lithography to steadily decrease the smallest feature size that can be formed as part of the integrated circuit pattern. The steady decline in feature size and cost and the corresponding increase in the density of features printed per circuit are commonly referred to as "Moore's Law" or the lithography "roadmap."

The lithography process involves creating a master image on a mask or reticle (mask and reticle are used interchangeably herein), then projecting an image from the mask onto a resist-covered semiconductor wafer in order to create a pattern that matches the design intent of defining functional elements, such as transistor gates, contacts etc., on the wafer. The more times a master pattern is successfully replicated on a wafer within the design specifications, the lower the cost per finished device or "chip" will be. Until recently, the mask pattern has been an almost exact duplicate of the desired pattern at the wafer level, with the exception that the mask level pattern may be several times larger than the wafer level pattern, due to an imaging reduction ratio of the exposure tool. The mask is typically formed by depositing and patterning a light absorbing material on quartz or another transparent substrate. The mask is then placed in an exposure tool known as a "stepper" or "scanner" where light of a specific exposure wavelength is directed through the mask onto the wafers. The light is transmitted through clear areas of the mask, but is attenuated by a desired amount, typically between 90 and 100%, in the areas covered by the absorbing layer. The light that passes through some regions of the mask may also be phase shifted by a desired phase angle, typically an integer multiple of 90 degrees. After being collected by the projection optics of the exposure tool, the resulting aerial image pattern is then focused onto the wafers. A light-sensitive material (photoresist or resist) deposited on the wafer surface interacts with the light to form the desired pattern on the wafer, and the pattern is then transferred into the underlying layers on the wafer to form functional electrical circuits according to well-known processes.

In recent years, the feature sizes being patterned have become significantly smaller than the wavelength of light used to transfer the mask pattern onto the wafer. This trend towards "sub-wavelength lithography" has resulted in increasing difficulty in maintaining adequate process margins in the lithography process. The aerial images created by the mask and exposure tool lose contrast and sharpness as the ratio of feature size to wavelength decreases. This ratio is quantified by the $k_1$ factor, defined as the numerical aperture (NA) of the exposure tool times the minimum feature size $W_f$ divided by the wavelength $\lambda$, i.e., $k_1 = NA \cdot W_f/\lambda$. There is limited practical flexibility in choosing the exposure wavelength, while the numerical aperture of exposure tools is approaching physical limits. Consequently, the continuous reduction in device feature sizes requires more and more aggressive reduction of the $k_1$ factor in lithographic processes, i.e. imaging at or below the classical resolution limits of an optical imaging system.

New methods to enable low-$k_1$ lithography have used master patterns on the mask that are no longer exact copies of the final wafer level pattern. The mask pattern is often adjusted in terms of the size and placement of pattern features as a function of pattern density or pitch. Other techniques involve the addition or subtraction of extra corners on the mask pattern ("serifs," "hammerheads," and other patterns) known as Optical Proximity Correction, or OPC; and the addition of other geometries that are not intended to be replicated on the wafer at all. The sole purpose of these non-printing "assist features," also known as Sub-Resolution Assisting Features (SRAFs) or scattering bars, is to enhance the printability of the "main features." The SRAFs are typically small bars (the term "bar" encompasses lines and other geometric shapes) placed close to the main features so that the printability of the main features is more robust against focus and/or dose change. All of these methods are often referred to collectively as Resolution Enhancement Technology (RET). With decreasing $k_1$, the magnitude of proximity effects increases dramatically. In current high-end designs, more and more device layers require RET, and almost every feature edge requires some amount of adjustment to ensure that the printed pattern will reasonably resemble the design intent. The implementation and verification of such extensive RET application is only made possible by detailed full-chip computational lithography process modeling, and the process is generally referred to as model-based RET.

The cost of manufacturing advanced mask sets is steadily increasing. Currently, the cost has already exceeded one million dollars per mask set for an advanced device. In addition, the turn-around time is always a critical concern. As a result, lithography-driven RET design, which assists in reducing both the cost and turn-around time, has become an integral part of semiconductor manufacturing.

As the lithography process entered below the 65 nm node (such as, 28 nm node), leading-edge chip designs have minimum feature sizes smaller than the wavelength of light used in advanced exposure tools. SRAFs become indispensable even if OPC techniques provide good results. Typically, OPC will modify the design layout so that a resist image (RI) contour is close enough to the design target at nominal condition. However, the Process Window (PW) is rather small without any extra features. SRAFs are needed to enhance the printability of the main features across a wider range of defocus and delta dose scenarios in order to maintain adequate process margins in the lithography process.

One method for implementing SRAFs that is widely in use is rule-based SRAF placement using an empirical (manual) rule-generator. In this method, a combination of benchmark test patterns with different SRAF configurations are printed (or simulated) on a wafer. Critical Dimension (CD) is then measured on the wafer, a set of rules for SRAF placement is drawn from the CD comparison, and finally the set of rules is used in SRAF placement for each main feature segment in a design. It should be noted that empirical rule-based SRAF placement requires an efficient mechanism to solve many conflicts between SRAFs derived from different main feature segments.

Another proposed method to generate SRAFs is based on inverse lithography techniques. In this method, the goal is to identify a mask image that minimizes an objective function (also referred to as a "cost function"). The objective function includes the difference between the resulting aerial image and the ideal design target image and also the difference between the aerial image intensity at the design target edge locations and the threshold for contours across wide ranges of defocus and delta dose conditions. To solve this non-linear programming problem, various iterative approaches are used to identify a local minimum solution.

While these methods have demonstrated some successes, their disadvantages have slowed the development cycle and limited their usage. For example, the empirical (manual) rule-generator has the following drawbacks: unable to take into account all possible patterns/spaces/line widths in a limited number of test patterns; high cost and low speed to manufacture the mask, print the wafer, and measure CD; difficulty in measuring the SRAFs' performance across the PW; and difficulty in resolving SRAF conflicts. The inverse lithography based method is also complicated and slow, since it may require quite a few slow iterations to converge. It may also converge to a local optimum, and it is not feasible to use it directly as it generates continuous values for each pixel while only rectangular shaped patterns with mask constraints are manufacturable. In addition, the objective function includes the difference between the whole aerial image and the design target, while in practice, the fidelity of the aerial image contours is of more interest. The focus on pixels deep inside or outside main features may be counterproductive.

Computer models have been created to come up with a faster and efficient SRAF placement algorithm that takes 2D pattern shapes into consideration and optimizes for a desired PW. This technique is called Model-Based Sub-Resolution Assist Feature (MB-SRAF) method. MB-SRAF methods have been exercised as the RET solution for certain applications, such as, for printing trench contacts, vias, and metal layers for 28 nm technology node.

Current MB-SRAF algorithms depend on signal mapping (i.e. measuring signal strength at various locations) to guide SRAF placements. The signal map, known as SRAF Guidance Map (SGM), is derived from variants of image contrast and process focus derivatives. Details of the generation of an SGM can be found in co-pending U.S. patent publication no. 2008/0301620, which is incorporated herein by reference. The current MB-SRAF methods are based on an initial SGM, which may not be optimized for a process window. There is a need for a method that can dynamically optimize the SGM, and can accommodate a large enough process window, while reducing the computational load.

SUMMARY

Embodiments of the present invention provide methods and systems for Model-Based Sub-Resolution Assist Feature (MB-SRAF) generation and placement. According to an aspect of the invention, signal strength of an SRAF guidance map (SGM) is iteratively enhanced to finally output an optimized set of SRAFs. An optimized "set" of SRAFs may include one or more SRAFs. SRAF polygons generated in a prior round of iteration are incorporated in an altered or unaltered mask layout to generate a subsequent updated SGM that is used to generate a subsequent set of SRAFs. The iterative process is terminated when a set of SRAF accommodates a desired process window (PW) or when a predefined PW criterion is satisfied. A cost function, representing a lithographic response, is predefined for the optimization process.

In one embodiment, iterations use progressively updated SGM and original mask layout to boost image signal for accurate SRAF placement. In another embodiment, iterations use progressively updated SGM and progressively updated mask layout with Optical Proximity Correction (OPC) for possible further improvement in signal strength and SRAF placement.

According to another aspect of the invention, a computer program product is disclosed that enables a computer to execute the above MB-SRAF signal boosting and SRAF placement optimization methods.

According to yet another aspect of the invention, a method is disclosed for enhancing signal strength for placing sub-resolution assist features ("SRAF") with respect to one or more target patterns in a mask layout. The method comprises: generating an initial SRAF guidance map for the mask layout; placing a first set of one or more SRAF in the mask layout according to the initial SRAF guidance map; altering one or more of number, location and dimension of at least a portion of the first set of one or more SRAFs; measuring improvement in signal strength in the initial SRAF guidance map; and generating an updated SRAF guidance map with enhanced signal strength.

Embodiments of the present invention provide an alternative faster solution than other computation-intensive techniques, such as, Inverse Lithography Technology (ILT) by improving the existing SGM-based SRAF generation method.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3A shows an example of SRAF placement before the methods of the invention are applied, and FIG. 3B shows an example of improved SRAF placement after the methods of the invention are applied.

FIGS. 9A-E show a set of SRAF solutions generated by different rounds of iterations, according to embodiments of the invention.

FIGS. 11A-B and 12 illustrate improvement in SRAF signal strength and SRAF placement accuracy for an example mask layout, according to an embodiment of the invention.

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1A:
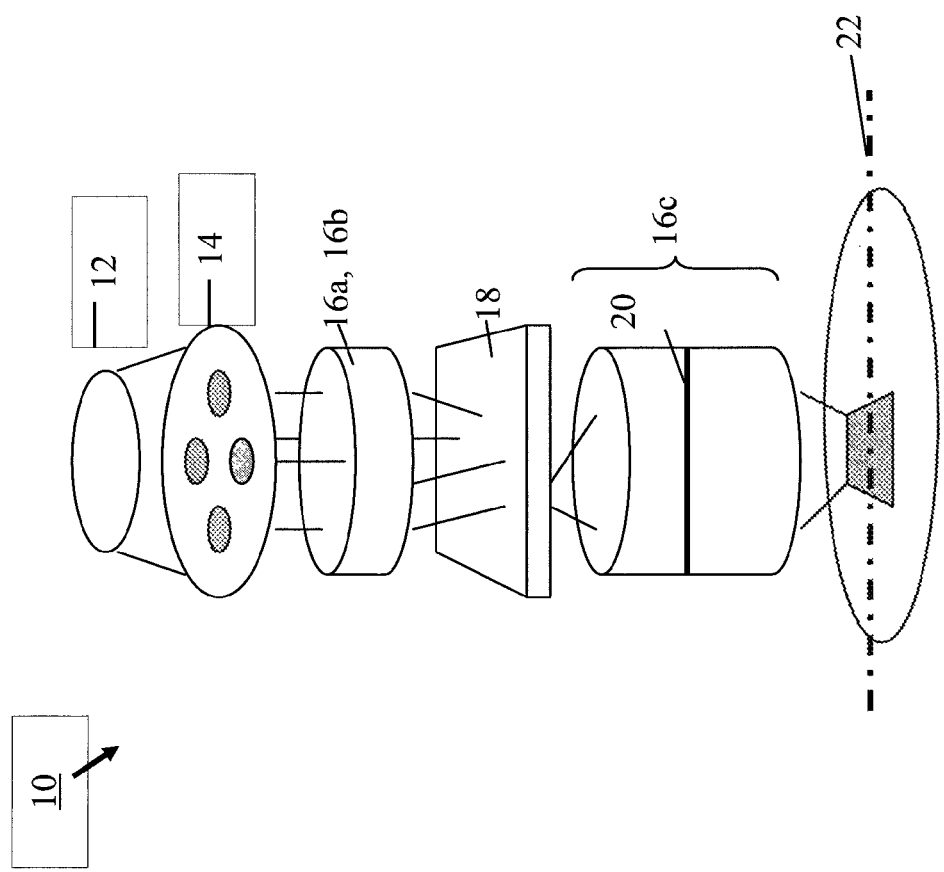
FIG. 1A is an exemplary block diagram illustrating a typical lithographic projection system.

General Environment in a Lithographic System for Implementing Example Embodiments of the Present Invention Prior to discussing the present invention, a brief discussion regarding the overall simulation and imaging process to be calibrated is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

Figure 1B:
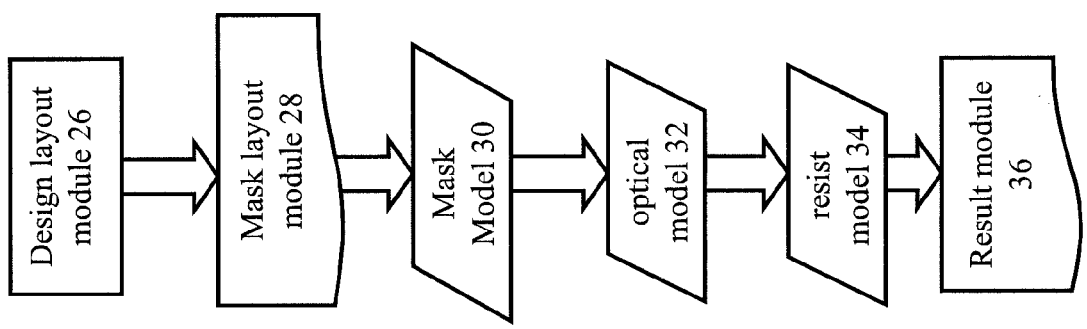
FIG. 1B is an exemplary block diagram illustrating the functional modules of a lithographic simulation model.

In a lithography simulation system, these major system components are described by separate functional modules, for example, as illustrated in FIG. 1B. Referring to FIG. 1B, the functional modules include the design layout module 26, which defines the target design; the mask layout module 28, which defines how the mask is laid out using the target design to be utilized in the imaging process; the mask model module 30, which models the properties of the physical mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma ($\sigma$) settings as well as any particular illumination source shape, where $\sigma$ (or sigma) is the inner and/or outer radial extent of the illuminator. The optical properties of the photo-resist layer coated on a substrate—i.e. refractive index, film thickness, propagation and polarization effects—may also be captured as part of the optical model module 32.

Finally, the resist model module 34 describes the effects of chemical processes which occur during resist exposure, PEB and development, in order to predict, for example, contours of resist features formed on the substrate wafer. The objective of the simulation is to accurately predict, for example, edge placements and critical dimensions (CDs), which can then be compared against the target design. The target design is generally defined as the pre-OPC mask layout, and will be provided in a standardized digital file format, such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (i.e. aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

As discussed in the background section, this invention updates the mask layout module 28 by optimizing an SRAF Guidance Map (SGM).

One method of generating an SGM includes: computing an image gradient map of the mask layout, and for each field point in the mask layout, computing a contribution of a hypothetical unit source placed at the field point. Each pixel in an SGM is assigned a value that represents the computed contribution of the hypothetical unit source. Each pixel value indicates whether the pixel would contribute positively to edge behavior of target patterns in the mask layout if the pixel is included as part of an SRAF. SRAFs are placed in the mask layout according to the generated SGM. The mask layout may be pre-OPC or post-OPC. Optionally, pre-defined SRAF placement rules may be followed in placing the SRAFs according to the SGM. Further details of SGM generation and SRAF placements can be found in co-pending U.S. patent publication no. 2008/0301620, which is incorporated herein by reference. The present invention discloses methods for iteratively optimizing signal strength of an SGM for improving SRAF placements.

Figure 2A:
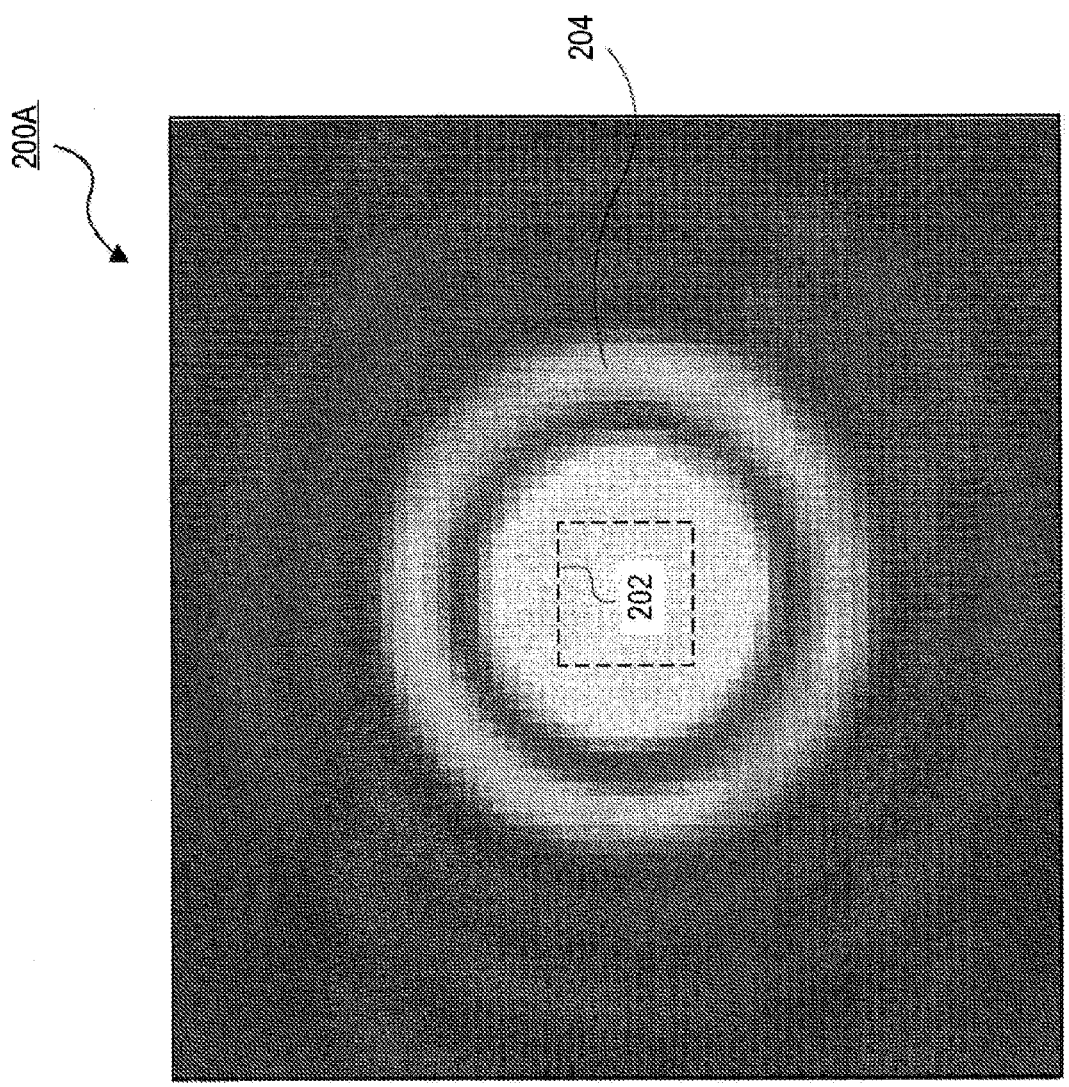
FIG. 2A schematically depicts an initial SGM intensity map generated corresponding to a "bulleye" illumination source with a square contact pad target pattern.
Figure 2B:
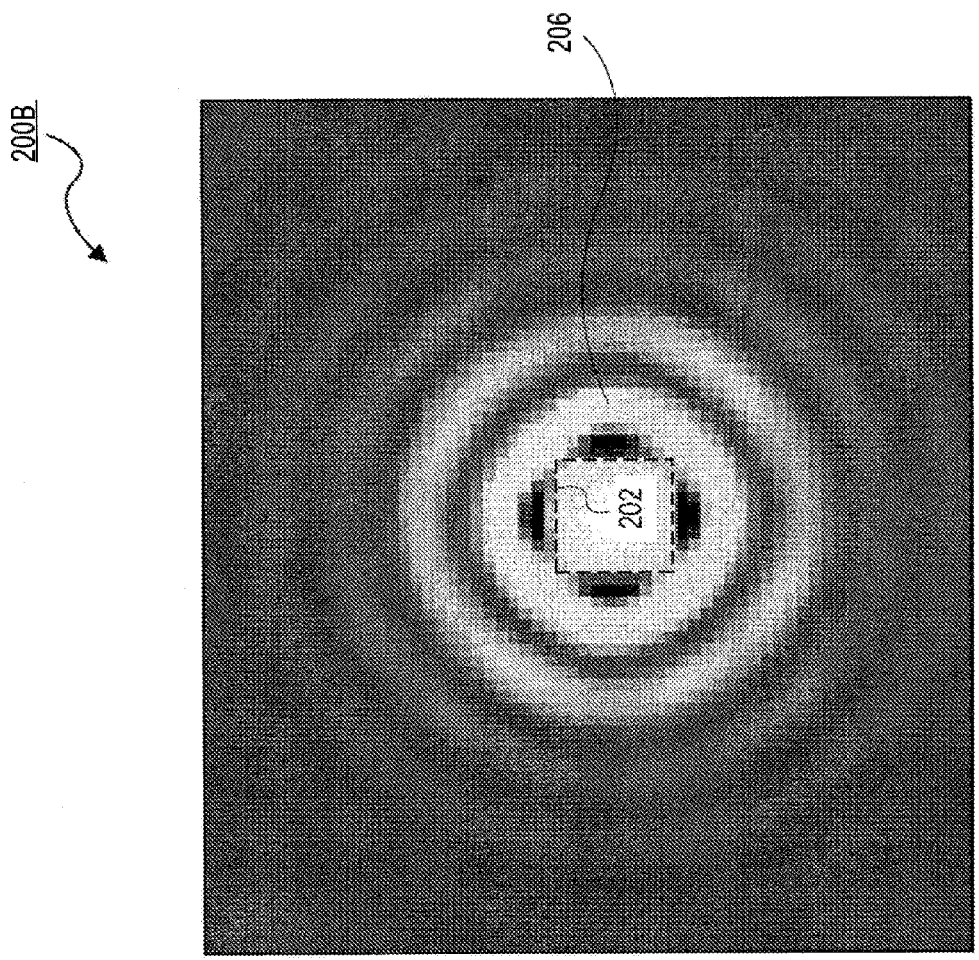
FIG. 2B schematically depicts the optimal SGM intensity map after the method of this invention is applied corresponding to the "bulleye" illumination source with the square contact pad target pattern.

FIG. 2A shows an SGM 200A generated with a "bull's eye" illumination source aligned with the center point of an example pre-OPC square contact pad target pattern 202, represented by the dotted outlines. SGM 200A is the initial SGM before the techniques of the present invention are applied. The dimension of the square pattern 202 can be, for example, 60 nm. However the invention is not limited by the dimension or shape of the target pattern in any way. Usually, SRAFs are placed in the annular region 204 with comparatively higher intensity. FIG. 2B illustrates an optimized SGM 200B after the techniques of the present invention are applied. Additional SRAFs may be placed in the newly defined high intensity region 206 identified by the application of the present invention. Additionally, signal strength of the other high-intensity annular regions are improved by the application of the present invention.

Example Embodiments of the Present Invention

Figure 3A:
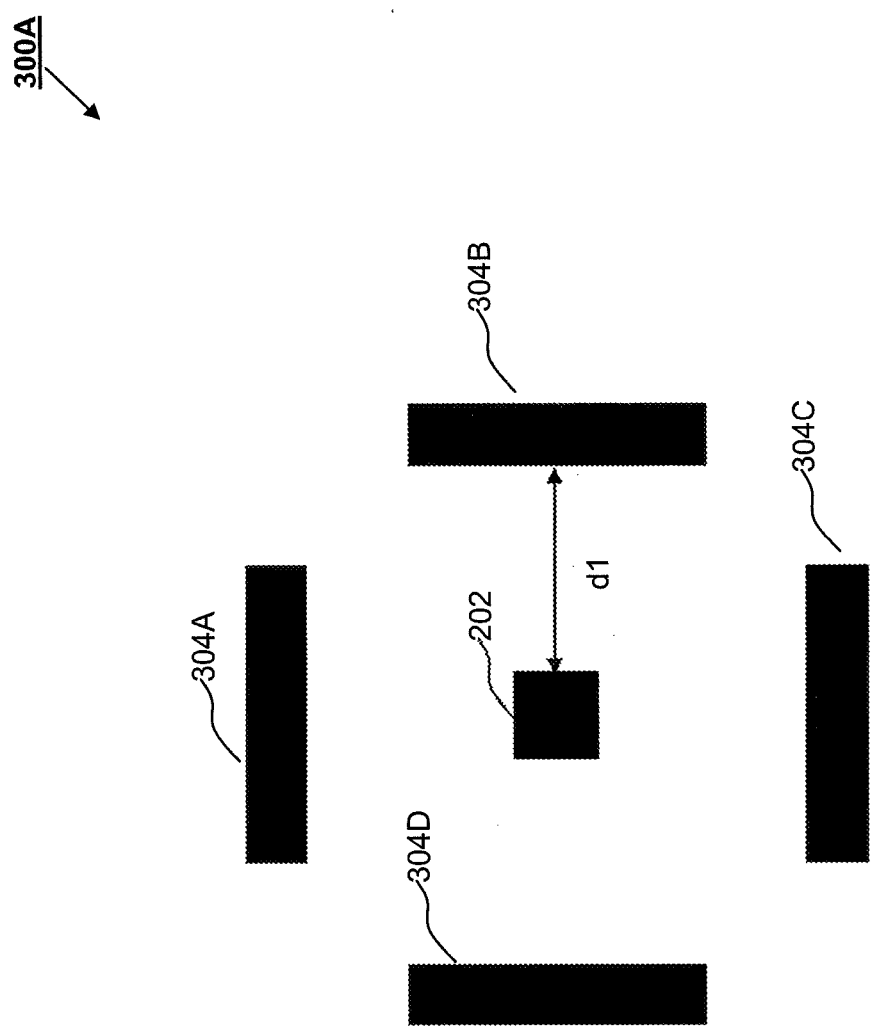
FIGS. 3A-B illustrate improvement in SRAF signal strength and SRAF placement accuracy for a square contact pad target pattern, according to an embodiment of the invention.

FIG. 3A shows a set of example SRAFs, non-printing scatter bars 304A-D, placed in the vicinity of the target patterns 202. In the example shown in FIG. 3A, the scatter bars 304A-D are at a distance d1 away from the target pattern 202. The layout 300A in FIG. 3A is typically generated by an existing simulation method to generate an SGM.

Figure 3B:
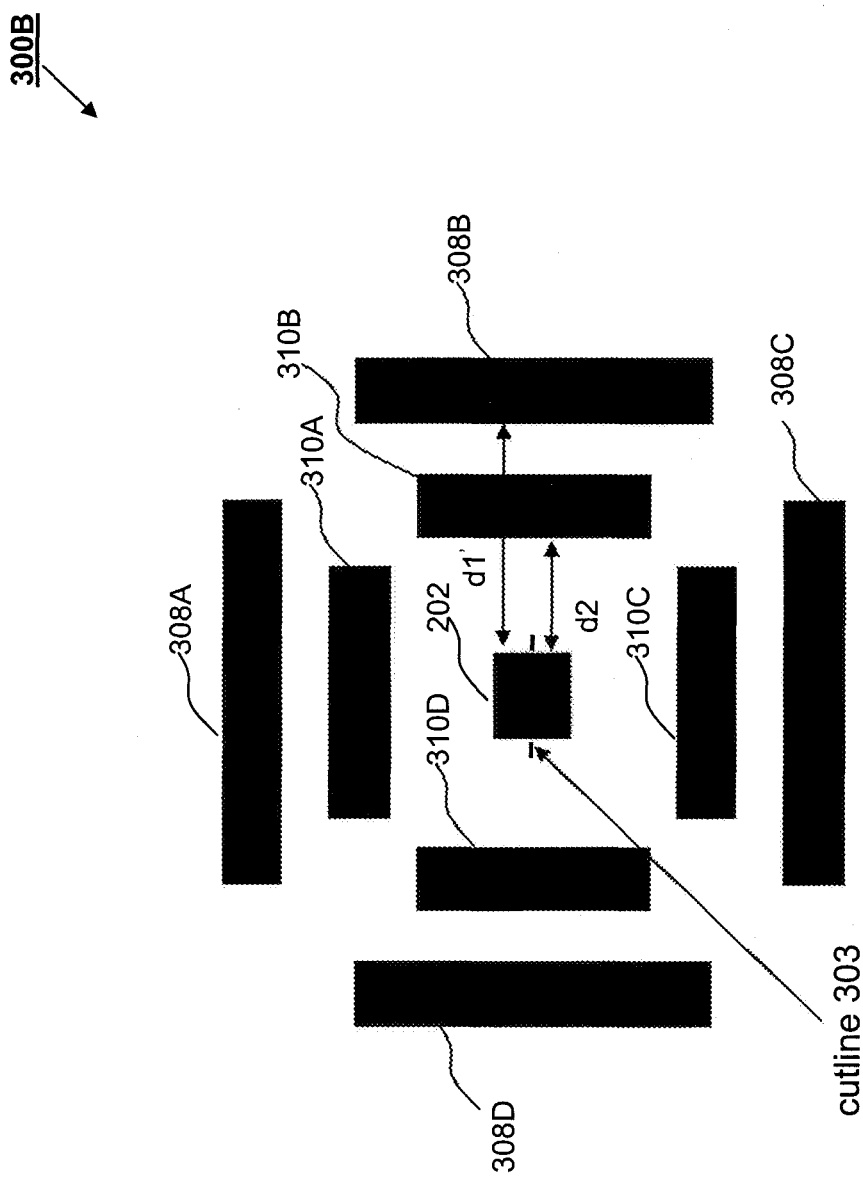

FIG. 3B shows a layout 300B, generated by the improved SGM generation algorithm of the present invention. Layout 300B includes a different set of SRAFs for the same target pattern 202. The simulation location is represented by a cutline 303 passing through the center point of the target pattern 202. SRAFs generated by simulation in the layout 300B includes an inner set of scatter bars 310A-D, which are placed a distance d2 away from the target pattern 202, in addition to the outer set of scatter bars, 308A-D, which may be placed at a distance d1', which may or may not be similar to d1. In an example, d1 may be 157 nm, and d2 may be 83 nm, though the scope of the invention is not limited by these example values of d1, d1', and d2. The dimension of scatter bars 308A-D in FIG. 3B may or may not be similar to the dimensions of scatter bars 304A-D of FIG. 3A. Addition of the scatter bars 310A-D improves the imaging of the target pattern 202.

Figure 4:
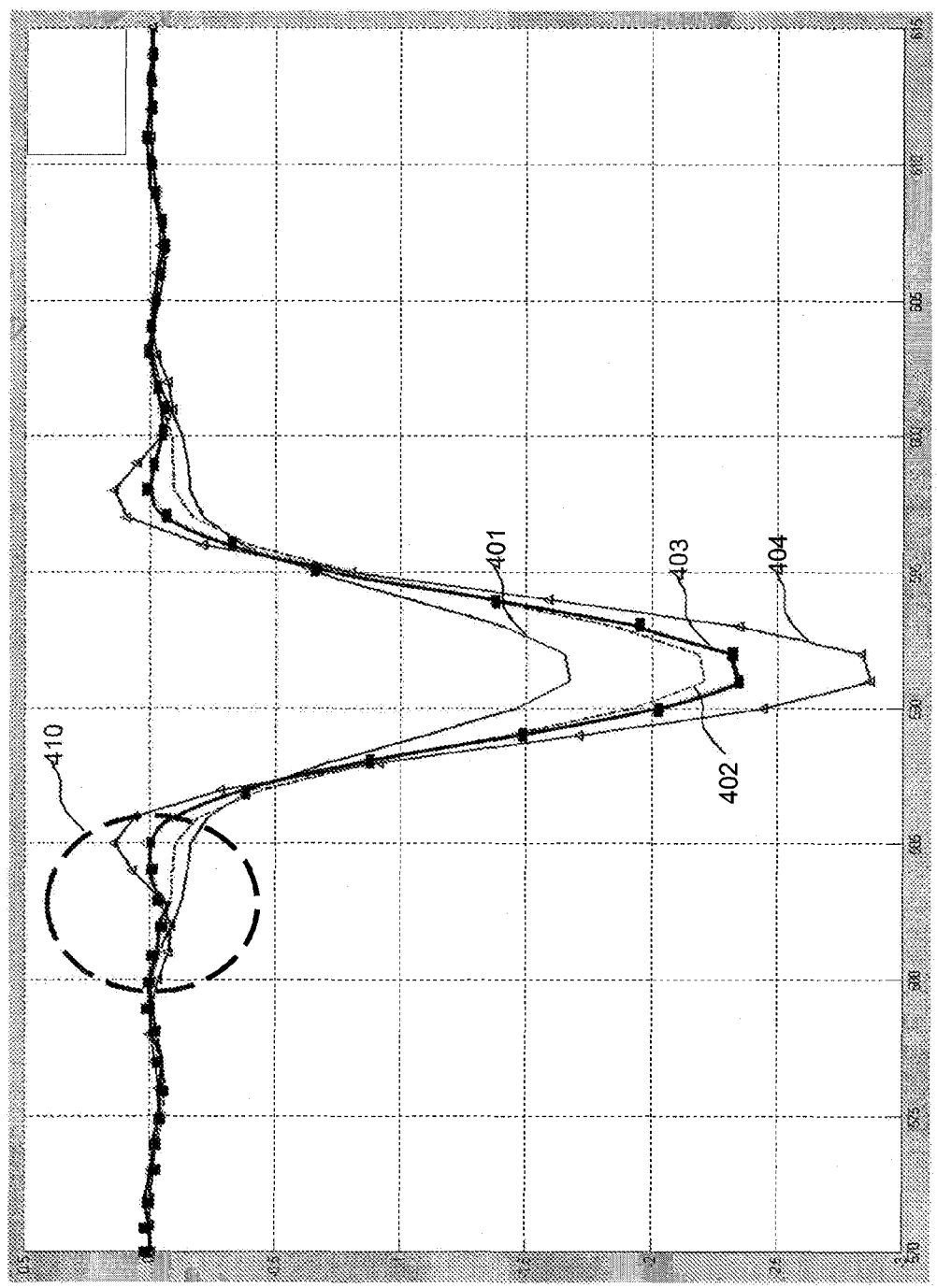
FIG. 4 illustrates improved lithographic response using SRAF for a square contact pad target pattern, according to an embodiment of the invention.

FIG. 4 shows signal profiles 401-404 along the cutline 303 plotted as a function of x-coordinate for the target pattern 202. The signal may represent a local intensity slope value. Other signal values may be used too, such as a local intensity slope normalized by critical dimension, inverse intensity slope, intensity divided by local slope, intensity divided by square of the local slope, process focus derivative signal, etc. The central dips in the signal profiles 401-404 are aligned with the center point of the target pattern 202. Signal profile 401 corresponds to an initial SGM, generated from the original pre-OPC mask layout. In the region 410 within the dashed outline, signal profile 401 does not show an easily discernable gradient, which is sufficient to identify a possible ridge location for SRAF placement. Therefore, using only the initial SGM, a lithographic simulation is not likely to place any SRAF in the region 410. Signal profile 401 may result in mask layout 300A shown in FIG. 3A. However, using the iterative algorithm of the present invention, signal strength and signal gradient in the region 410 are improved progressively. Profiles 402, 403, and 404 correspond to $2^{nd}$, $3^{rd}$, and $4^{th}$ SGMs respectively, which are results of increasing number of optimizing iterations. Profile 404 clearly shows a discernable dip in signal within region 410. Therefore, it will be beneficial to place SRAFs in the region 410. Signal profile 404 may result in mask layout 300B shown in FIG. 3B, where additional SRAF scatter bars 310A-D are placed at the mask layout coordinates included in the region 410.

Figure 5:
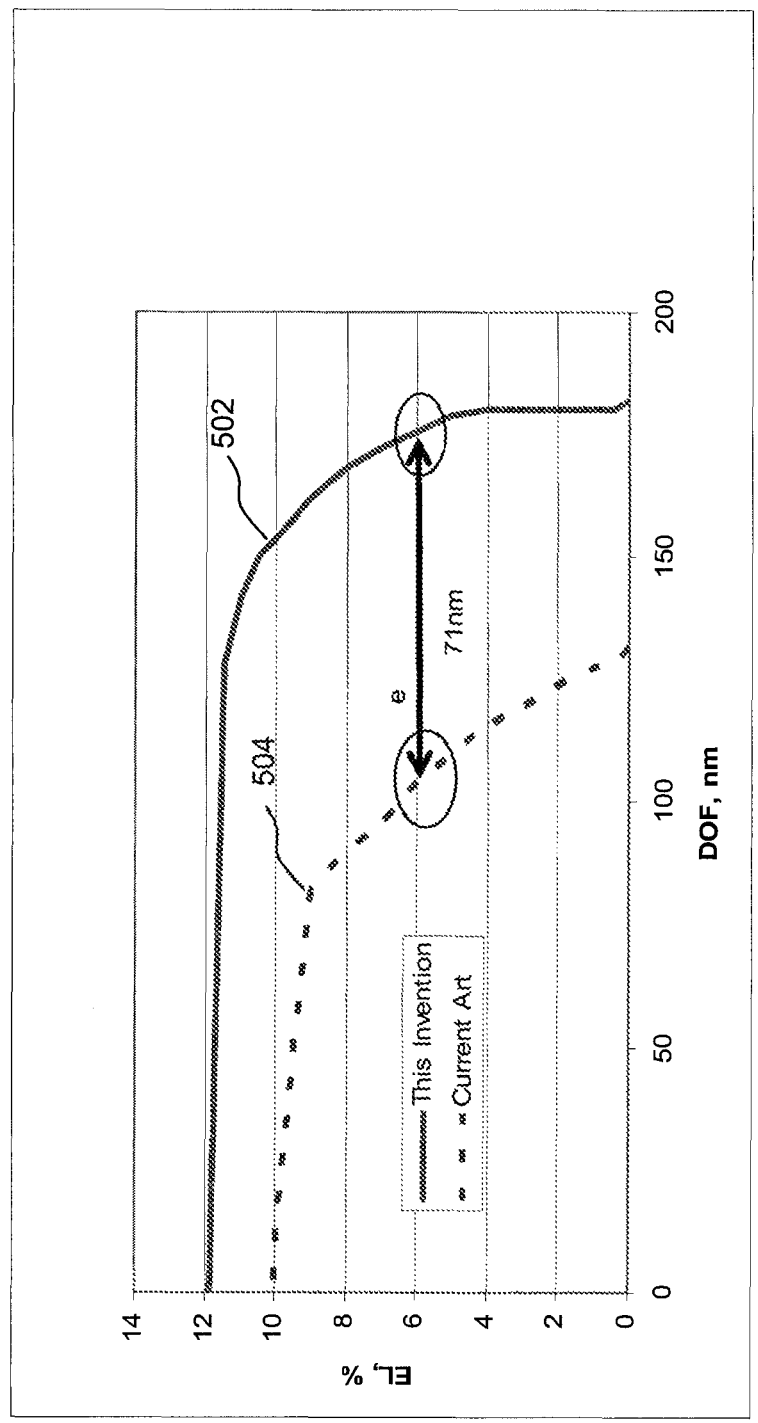
FIGS. 5-6 illustrate improvement in lithographic process window using embodiments of the invention.

FIG. 5 graphically illustrates how example embodiments of the present invention accommodate better process window as a result of improved generation and placement of SRAFs around a target pattern 202, when compared to the existing simulation methods in the art. The X-axis and Y-axis in FIG. 5 represent Degree of Freedom (DOF) values and Exposure Latitude (EL) percentage values, respectively. The dashed curve 504 represents results from the existing art simulation method, while the solid curve 502 represents results from the simulation method of the present invention. As indicated in FIG. 5, the present invention improves the DOF by 'e'), which accounts for DOF improvement. In the example shown in FIG. 5, 'e' is 71 nm, corresponding to 68% improvement in DOF. In other words, generating a more comprehensive set of SRAFs and improving SRAF placement in a mask layout according to the embodiments of the present invention significantly improve process window in a lithographic process.

Figure 6:
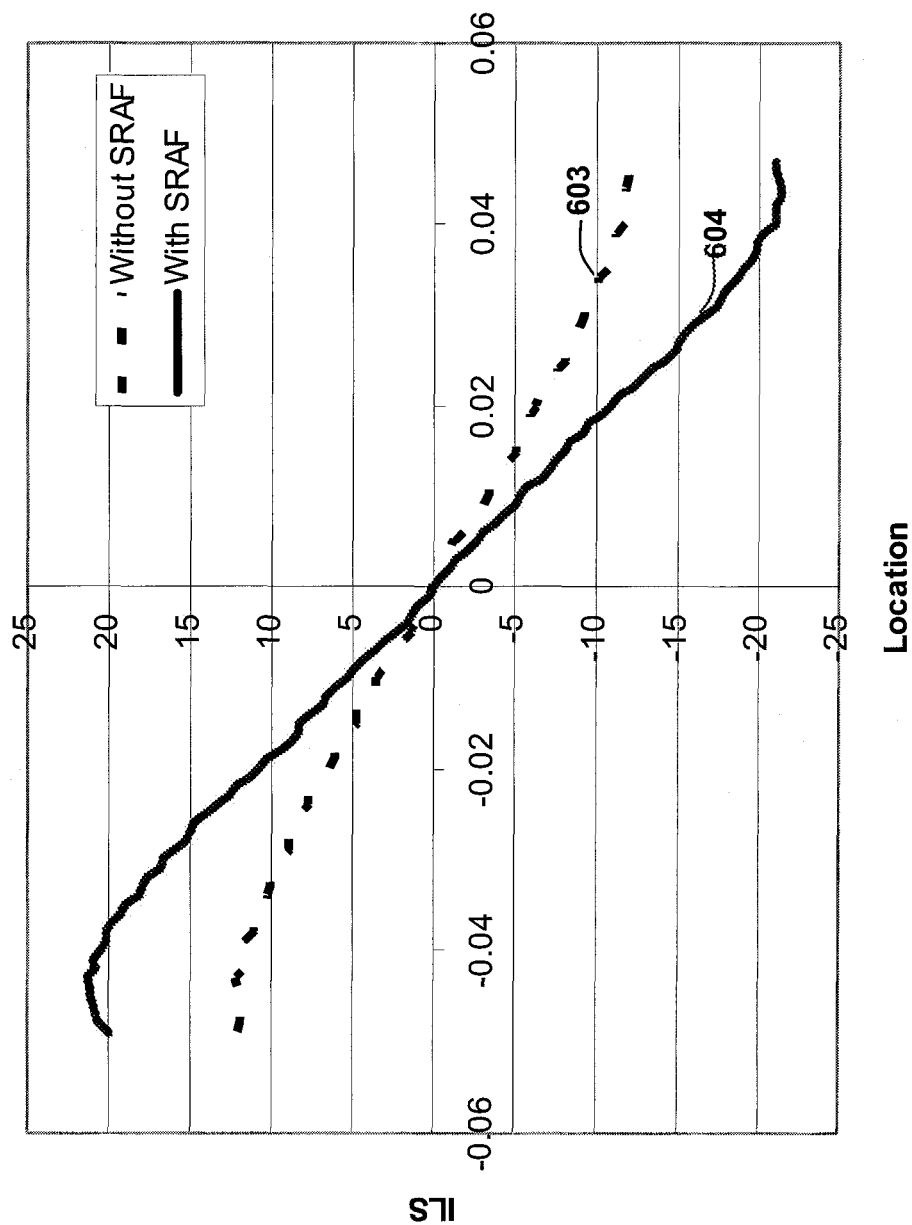

FIG. 6 shows a plot of image log slope (ILS) value as a function of x-coordinate along the cutline 303 shown in FIG. 3B. The (0,0) point of the plot in FIG. 6 is the center point of the target pattern 202. FIG. 6 shows that when no SRAF is placed (i.e., neither an existing SRAF generation algorithm is used, nor the SRAF generation algorithm of the present invention is used), the ILS values (along curve 603) are lower than the ILS values (along curve 604) obtained with SRAFs placed according to an algorithm of the present invention. Improved ILS indicates improved image contrast. ILS can be used as a possible objective function or cost function that is used in the iterative optimization process of the present invention. Other possible cost functions may include, an edge placement error (EPE) value, a Mask Error Enhancement Factor (MEEF) value, or any possible combination of ILS, EPE and MEEF, etc.

Figure 7:
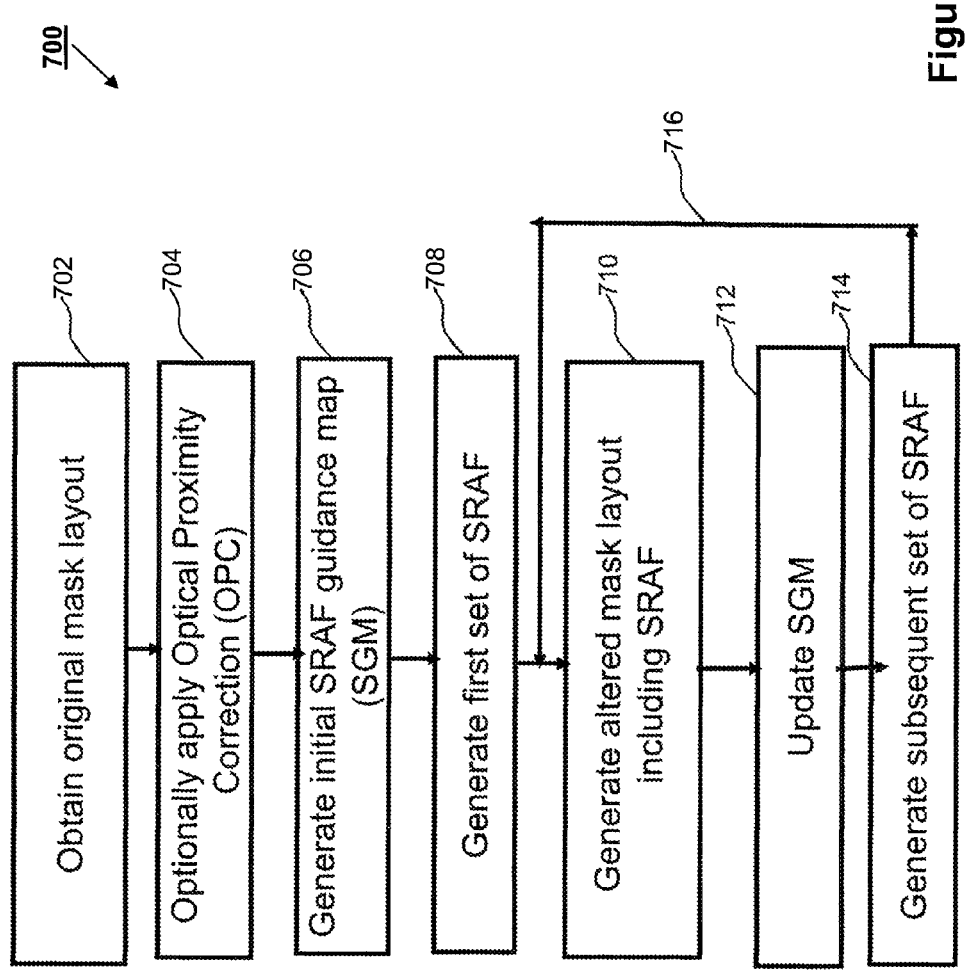
FIGS. 7 and 8A-B show flowcharts illustrating example process steps, according to various embodiments of the invention.

FIG. 7 shows a flowchart that illustrates example steps of a method 700 for improved generation and placement of SRAFs, according to an embodiment of the present invention. Method 700 starts at step 702, where an original mask layout is obtained. Original mask layout comprises the target patterns before any OPC is applied. In step 704, optionally OPC may be applied to the target patterns. In step 706, an initial SGM is generated from the pre-OPC or post-OPC mask layout. In step 708, a first set of SRAFs are generated based on the initial SGM. In step 710, an altered mask layout is generated, where the pre-OPC or post-OPC target patterns and the first set of SRAFs are placed simultaneously. In step 712, the SGM is updated based on the altered mask layout of step 710. In step 714, a subsequent set of revised SRAFs are generated and placed in the mask layout. Steps 710, 712, and 714 may be repeated iteratively, as shown by the path 716, until a pre-defined simulation termination condition is satisfied.

The main difference in method 700 compared to the existing art is that, in the existing art, only an initial SGM is used, whereas, in method 700, SGM is progressively updated to generate a better optimized SGM that facilitates in generating a more comprehensive and more accurately placed set of SRAFs. In generating updated SGM, not only the target pattern geometry (pre-OPC or post-OPC) is considered, but the geometry of a prior set of SRAF polygons located in the altered mask layout is also considered. In this manner, the signal strength of the SGM is iteratively boosted, so that a subsequent set of SRAFs are more easily and accurately generated and placed.

Persons skilled in the art will appreciate that the progressive updating of the SGM is done by measuring the improvement in signal strength in the SGM. Improvement of signal strength of SGM is a result of selecting the appropriate SRAF(s) for a target pattern. A single SRAF or multiple SRAFs may contribute to improvement in SGM signal strength. The term "a set of SRAF" encompasses one SRAF or multiple SRAFs. When a prior set of SRAF is altered to update the SGM, the entire set of SRAF may be replaced, or only one or a few of the SRAFs from the prior set may be altered. The alteration of SRAFs may include alteration of dimension of SRAFs, alteration of number of SRAFs, and/or alteration of location of SRAFs. In an example embodiment, only location of the SRAFs may be changed to update SGM without changing the dimension of the SRAFs. In another embodiment, only dimension of one or more SRAFs may be changed without changing the location of the SRAFs. In yet another embodiment, the number of SRAFs may be changed but location and dimension of the at least a portion of the prior set of SRAFs are kept intact. Number of SRAFs may be determined by the effectiveness to achieve a predefined PW criterion and by mask manufacturing rule check (MRC) constraints. When SGM does not improve anymore, adding more SRAFs does not help. Again, persons skilled in the art will appreciate that the examples are for illustrative purposes only, and other possible alterations of SRAFs can be done if improvement in the SGM is observed.

Figure 8A:
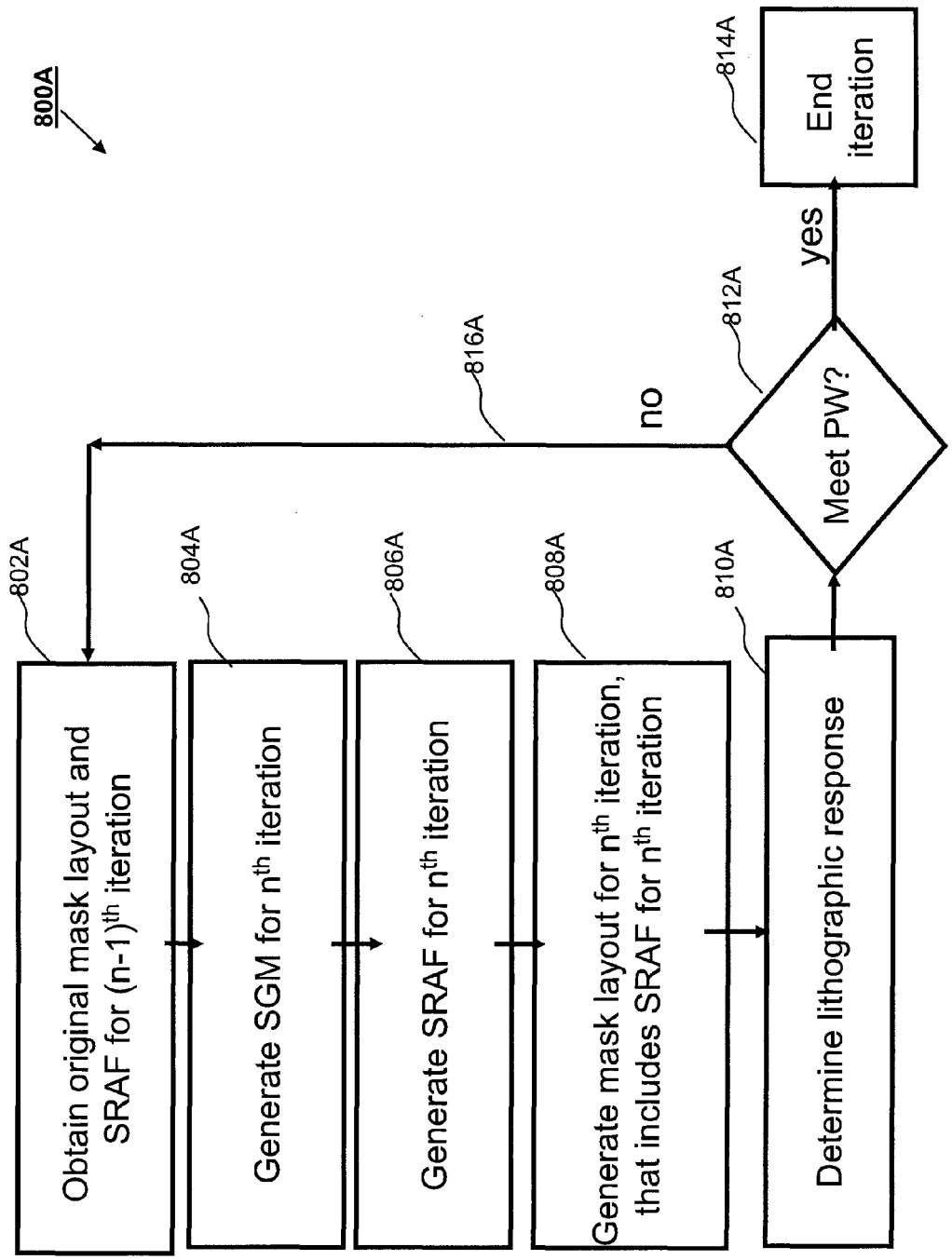
Figure 8B:
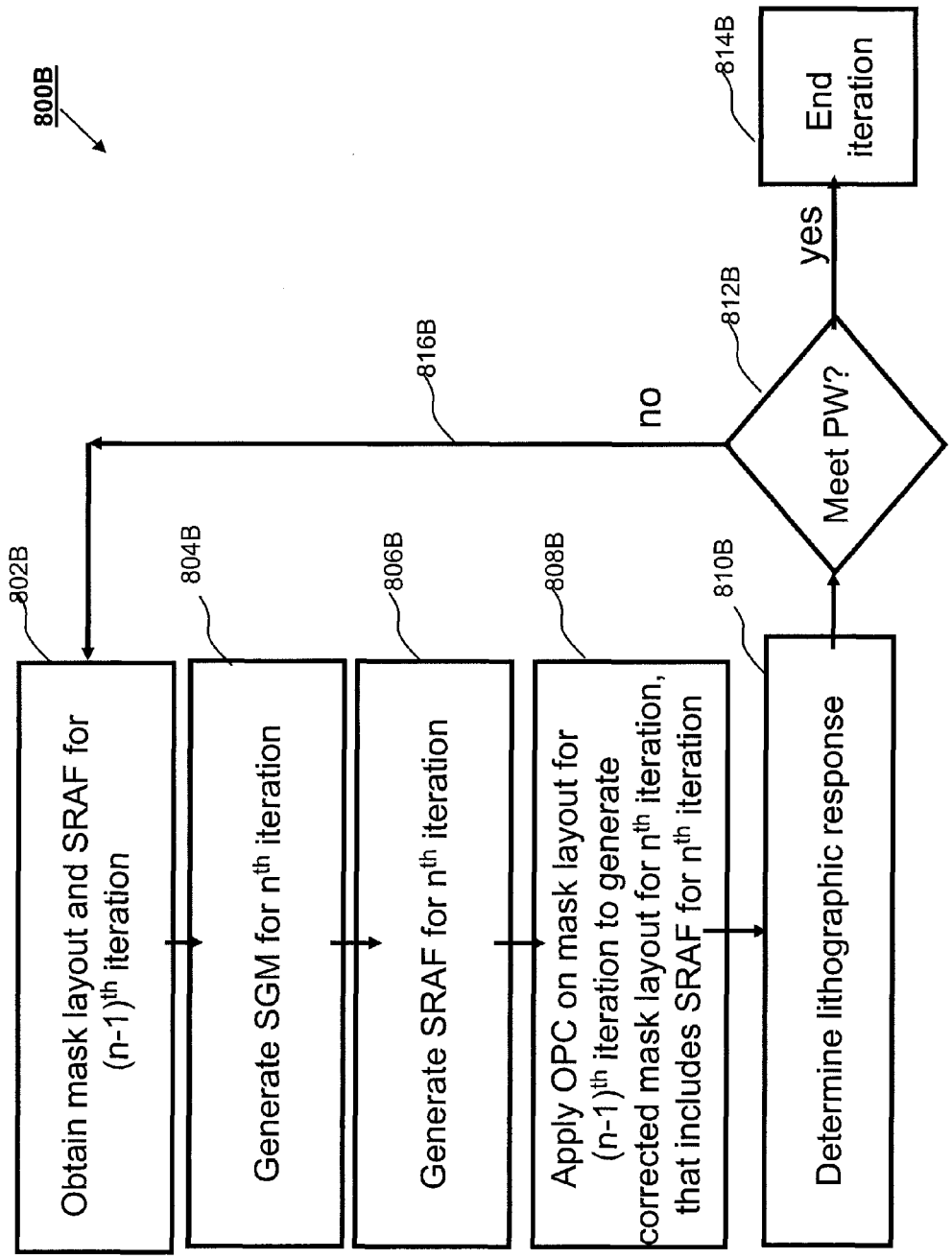

FIGS. 8A-B show two embodiments of the optimization method 700. The flowchart in FIG. 8A shows a short-loop or partial-loop optimization process 800A, and the flowchart in FIG. 8B shows a full-loop or long-loop optimization process 800B. Process 800A and 800B only show the iterative portion of the process 700 that starts after step 708.

Process 800A starts at step 802A, where original mask layout (without OPC) is obtained. The SRAFs from the immediately prior iteration step, i.e. $(n-1)^{th}$ iteration step, are also obtained. In other words, the altered mask layout in step 802A includes original target patterns plus the SRAFs from the $(n-1)^{th}$ iteration.

In step 804A, SGM for the $n^{th}$ iteration is generated based on the altered mask layout of step 802A.

In step 806A, SRAFs are generated for the $n^{th}$ iteration from the SGM in step 804A.

In step 808A, an altered mask layout is generated that includes SRAFs from step 806A, as well as the original target patterns (without OPC).

In step 810A, a lithographic response is determined using the altered mask layout of step 808A. the lithographic response may be defined by a cost function, such as an ILS, and EPE, or a combination of ILS and EPE. The lithographic responses are associated with the parameters of the process window. Typical process window parameters are focus, exposure dose, etc. Persons skilled in the art will appreciate that these are only a few examples of the possible lithographic responses and process window parameters that can be tracked, and the scope of the invention is not limited by the choice of lithographic response and process window parameters.

In step 812A, it is determined whether desired process window is accommodated (or a predefined process window criterion is met) or not by the current altered mask layout at the end of the $n^{th}$ iteration. If process window criterion is satisfied, then the iteration is terminated. If not, then the iteration is continued to the next iterative step, as shown by the path 816A. Persons skilled in the art will appreciate that the predefined process window criterion may include a situation where the iteration does not necessarily convolute, but still a specific predefined PW size is accommodated.

Method 800B shown in FIG. 8B is different from the method 800A in terms of the initial mask layout that is used in step 802B. Instead of using the original mask layout, in step 802B, the altered mask layout generated at the end of the immediately prior round of iteration, i.e. the $(n-1)^{th}$ iteration is used to generate the SGM for the $n^{th}$ round of iteration in step 804B.

Steps 804B and 806B are similar to steps 804A and 806A.

In step 808B, further OPC is applied to the altered mask layout from the $(n-1)^{th}$ iteration. The corrected altered mask layout at the end of step 808B includes post-OPC target patterns (OPC may have been applied (n-1) times to the original target patterns) and SRAFs generated by the $n^{th}$ iteration.

Steps 810B, 812B, 814B and path 816B are similar to the corresponding steps/paths in FIG. 8A.

Persons skilled in the art will appreciate that the methods shown in FIGS. 7 and 8A-B only depict illustrative steps. Not all the steps need to be included in every embodiment, and additional intermediate/terminal steps may be included in the methods, as applicable. The sequence of the steps may be altered. The method of iteratively placing a subsequent set of SRAF may comprise replacing a prior set of SRAF altogether with a completely new subsequent set of SRAF. Alternatively, the method may comprise retaining at least portions of a prior set of SRAF, and adjusting the prior set of SRAF to obtain the subsequent set of SRAF.

Figure 9B:
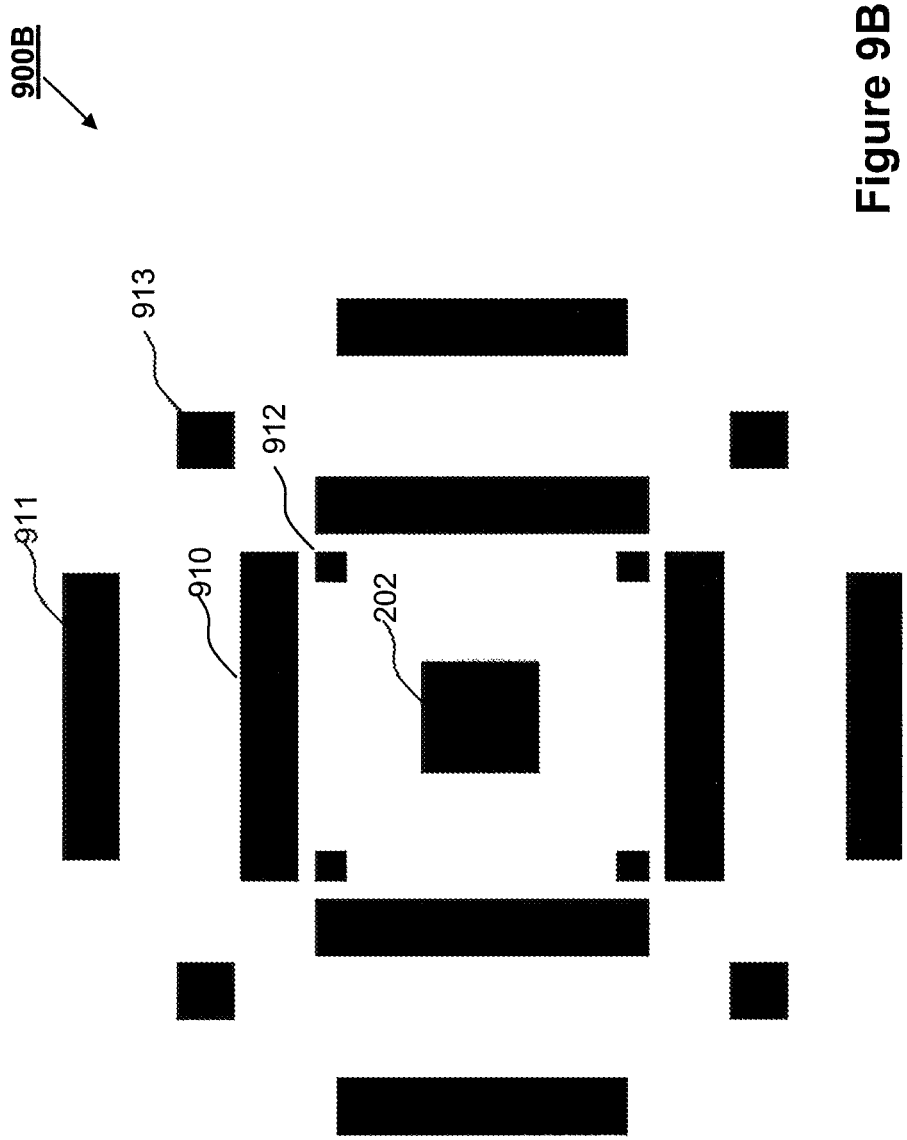

FIGS. 9A and 9B show that the iterative SRAF solution does not have to be unique. For example, the layout 900A of FIG. 9A shows SRAF solution without corner considerations, and the layout 900B of FIG. 9B shows SRAF solution with corner consideration. Layout 900A shows edge-aligned scatter bars 905 and 906 (other similar scatter bars are not labeled for the sake of clarity). Layout 900B shows edge aligned scatter bars 910 and 911, and additional corner SRAFs 912 and 913. Note that edge aligned scatter bars 905 and 906 may be placed at different locations than edge aligned scatter bars 911 and 910. Their dimensions may differ from one another too.

Figure 9D:
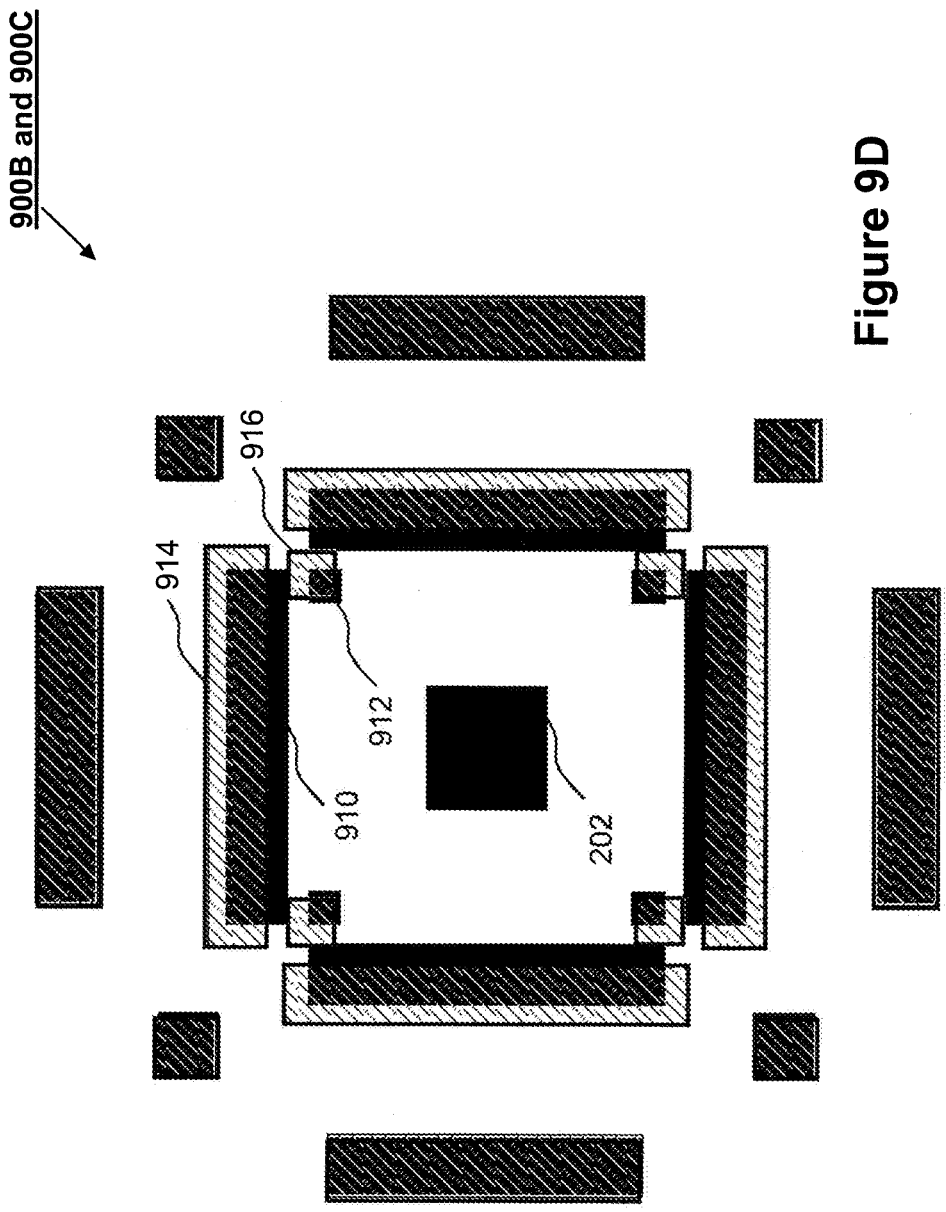

FIG. 9D shows that in progressive rounds of iteration, location and dimension of corner SRAFs and/or edge aligned scatter bars may vary. FIG. 9D superimposes layout 900B of FIG. 9B and layout 900C of FIG. 9C to accentuate the relative differences between the layouts 900B and 900C. In FIG. 9D, the SRAFs of layout 900C (e.g., scatter bar 914, corner SRAF 916 etc.) are shown in hatched lines.

Figure 9E:
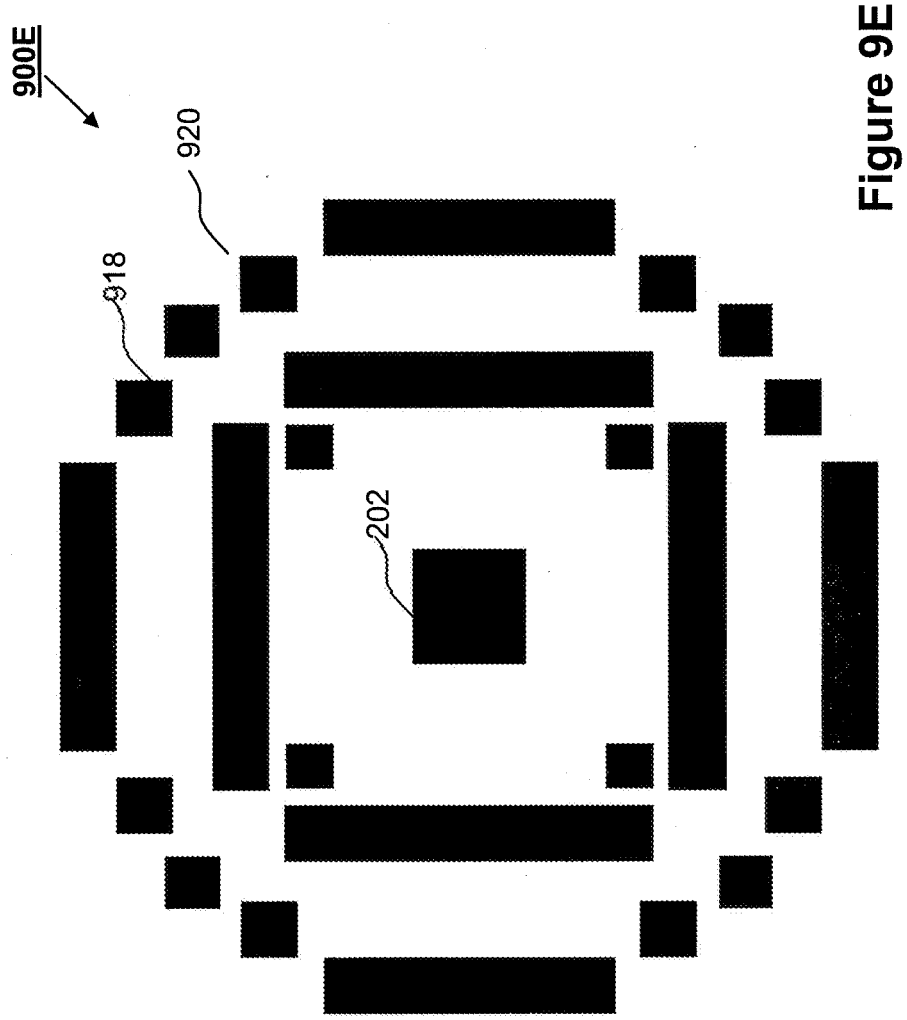

In FIG. 9E, layout 900E is shown, which shows yet additional corner SRAFs 918 and 920, that did not appear in the prior layouts 900B or 900C. Therefore, it can be understood that as a result of iterative refinement, additional SRAFs may be generated. In some cases, some SRAFs may be discarded too if performance improvement is achieved by discarding some SRAFs. Usually the iteration is terminated when the difference in performance improvement is negligible between two successive rounds of iterations.

Figure 10:
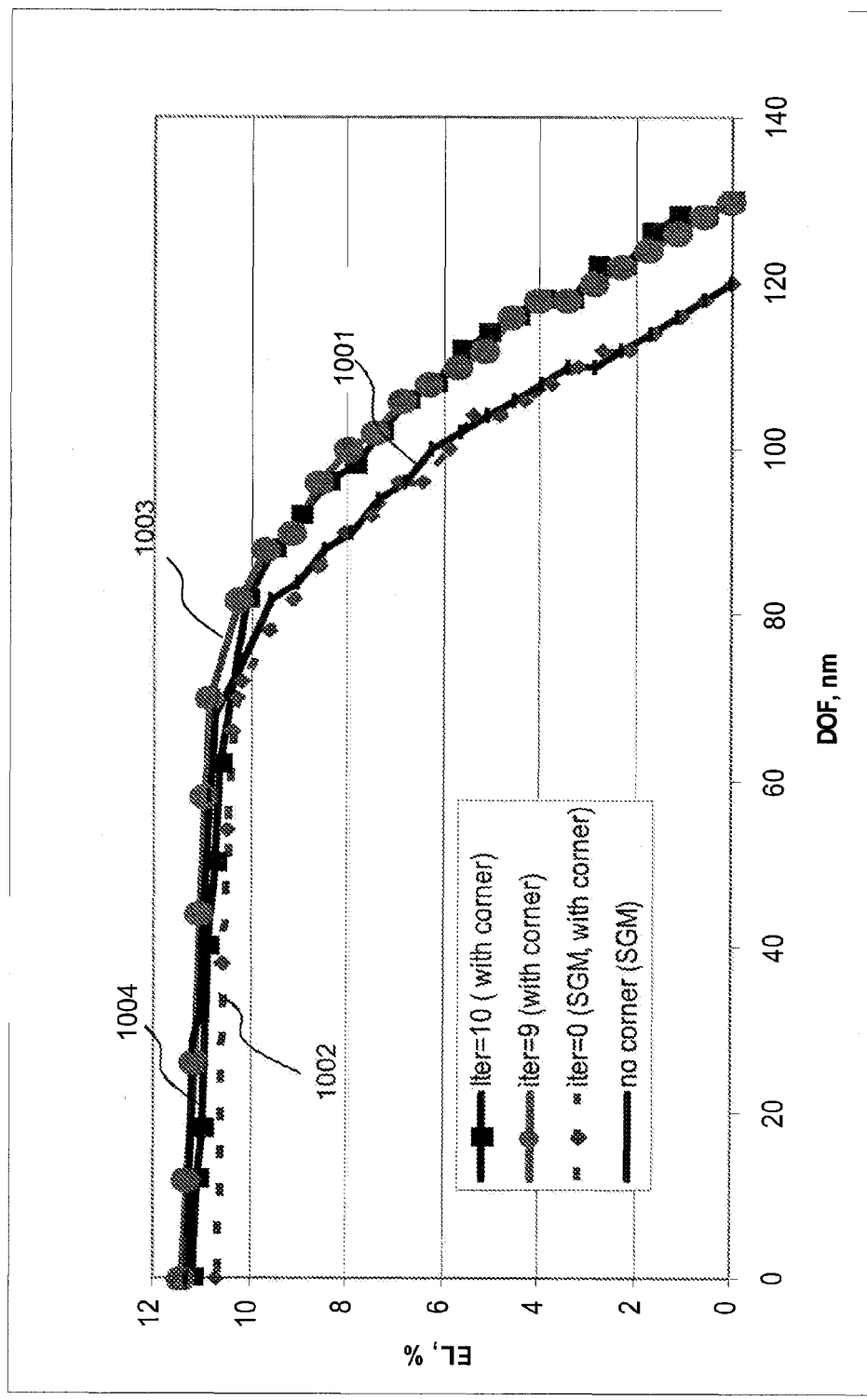
FIG. 10 illustrates depth of focus (DOF) values associated with various SRAF solutions, according to embodiments of the invention.

FIG. 10 shows comparative performance improvement, i.e. improvement in process window, corresponding to various SRAF solutions. The X-axis in FIG. 10 represents DOF values, and the Y-axis represents exposure latitude (%) values. Plot 1001 shows the DOF-EL curve for an SRAF solution based on an initial SGM (before the iterative process of the present invention starts), and without corner consideration. Plot 1002 shows the DOF-EL curve for an SRAF solution based on an initial SGM (before the iterative process of the present invention starts), and with corner consideration. The DOF improvement between plots 1001 and 1002 is not significant. However, the DOF values are noticeably improved after $9^{th}$ iteration. Plot 1003 shows the result after $9^{th}$ iteration, with corner consideration (i.e., SRAF solution shown in FIG. 9C), and plot 1004 shows the result after $10^{th}$ iteration, with additional corner consideration (i.e., SRAF solution shown in FIG. 9E). DOF improvement between plots 1002 and 1003 is significant (about 10 nm at 5% EL). But DOF improvement between plots 1003 and 1004 is not significant. Therefore, the additional corner SRAFs 918 and 920 in layout 900E do not contribute significantly to performance improvement. Accordingly, the $9^{th}$ iteration solution may be selected as the optimum solution instead of the $10^{th}$ iteration solution, and the iterative process may be terminated after the $10^{th}$ iteration.

So far, placement of SRAFs around a relatively isolated square target pattern 202 has been described. Target pattern 202 has enough room around it for placing SRAFs. Target pattern 202 may be part of an array, but the array does not have a very tight pitch in either Cartesian direction. FIGS. 11A-B depict a much larger mask layout, where the pitch in Y-direction is very tight. Thus SRAF bars 1105 parallel to the Y-axis are placed in between successive contact pads in X-direction. Other SRAF patterns are also placed around the contact pads.

FIG. 11A shows an example patch-boundary layout, where dashed boundary lines 1101 and 1102 demarcate four patches 1150, 1160, 1170, and 1180. Region 1104 within the dashed circular outline shows inconsistencies in SRAF placement (e.g., SRAF scatter bards are discontinuous) due to weak signal strength that can not generate an optimal SGM for the entire layout. A cutline 1103 is placed within the inconsistent region 1104 to prove the efficacy of the iterative optimization process of the present invention. In FIG. 11B, it is shown that after 10 short-loop iterations, an SRAF solution is obtained which eliminates the inconsistencies within region 1104 and elsewhere in the layout by boosting signal strength for producing a better optimized SGM, resulting in better imaging.

Figure 12:
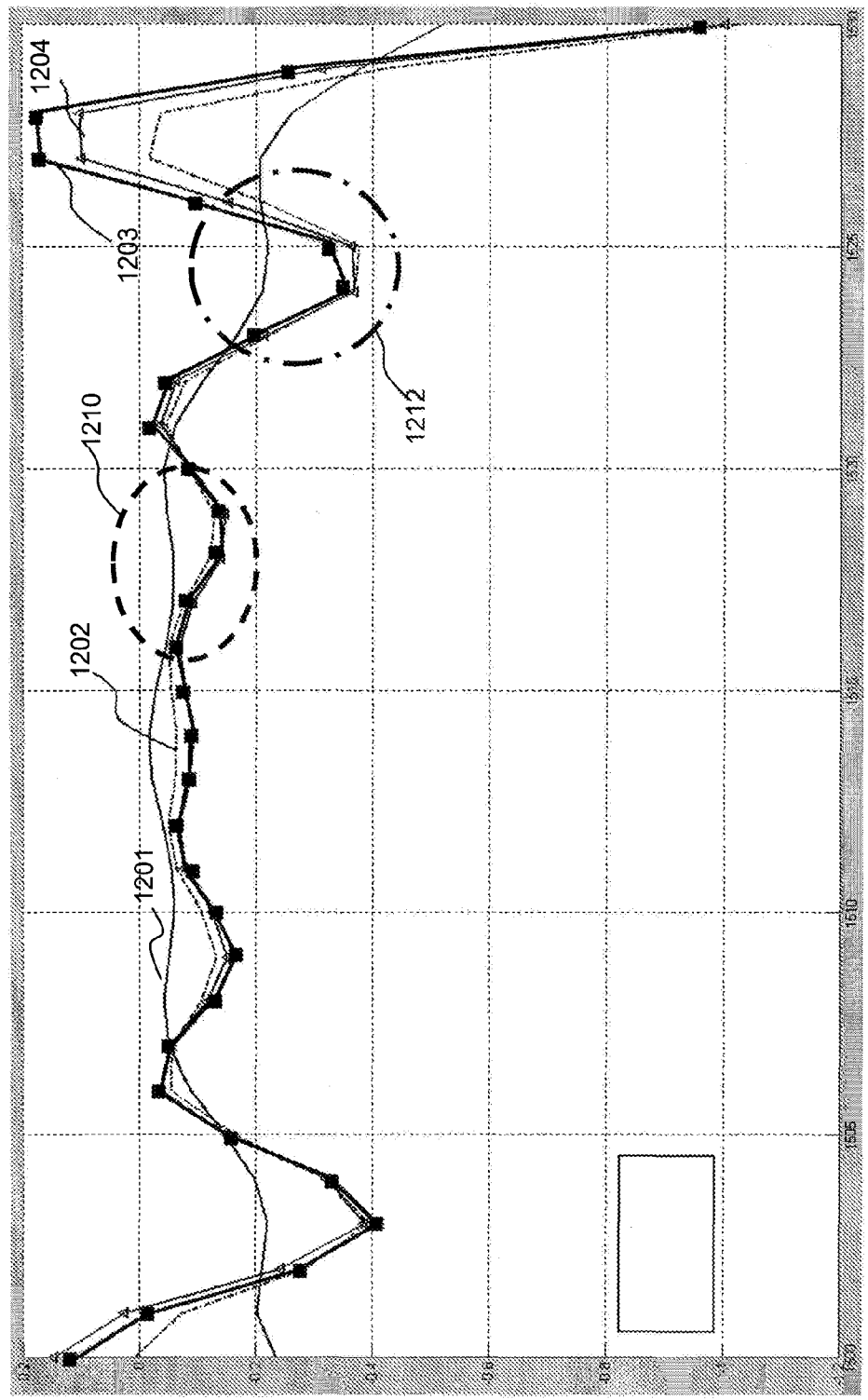

FIG. 12 shows comparative plots of SRAF signal along the cutline 1103 shown in FIG. 11A. Signal profile 1201 corresponds to initial SGM before the iterative optimization started. Within illustrative regions 1210 and 1212 (within the dashed and dash-dotted outlines respectively), the signal slope of profile 1201 is not discernable enough to place SRAFs with edge accuracy. However, signal profiles 1202, 1203 and 1204 progressively improve signal strength as a result of successive iterations. For $3^{rd}$ and $4^{th}$ iterations, signal strength variation is prominent enough (as shown by signal profiles 1203 and 1204 respectively) to clearly identify a ridge location where a SRAF should be placed.

Figure 13:
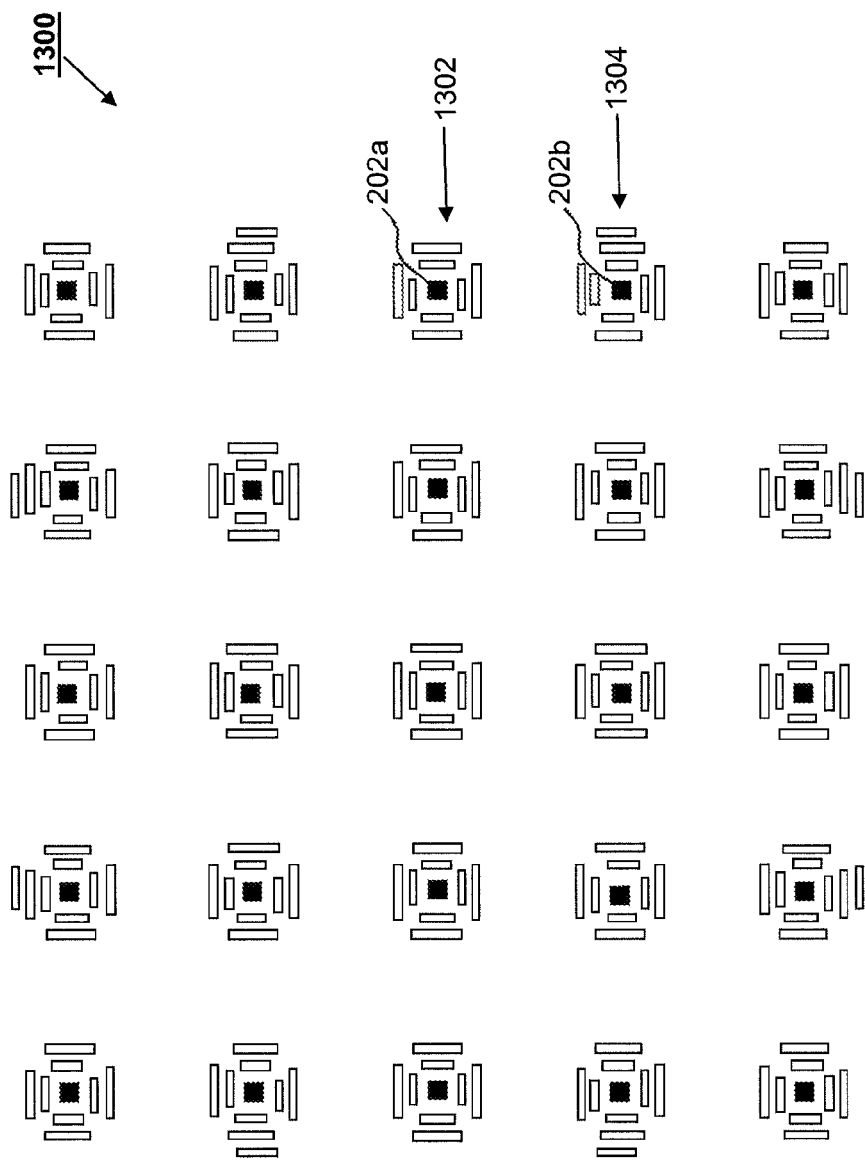
FIG. 13 illustrates an array of target patterns with corresponding symmetric or asymmetric SRAFs, according to an embodiment of the present invention.

FIG. 13 shows an array 1300 of contact pad target patterns 202 with corresponding SRAFs placed in the vicinity of each pattern 202. It is to be noted that SRAFs corresponding to each target pattern 202 do not need to be exactly similar. For example, in the array element 1302, the target pattern 202a has a symmetric set of SRAFs (4 inner scatter bars and 4 outer scatter bars). However, in the array element 1304, the target pattern 202b has an asymmetric set of SRAFs (4 inner scatter bars, 4 intermediate scatter bars, and one outermost scatter bar on the right side only). The asymmetry may be associated with one or more target patterns 202 placed at an edge of array 1300. As discussed before, persons skilled in the art will appreciate that though a plurality of SRAFs are shown around each target pattern 202, the scope of the invention is not limited by the number of SRAFs. An optimized "set" of SRAF may include just one SRAF.

Figure 14:
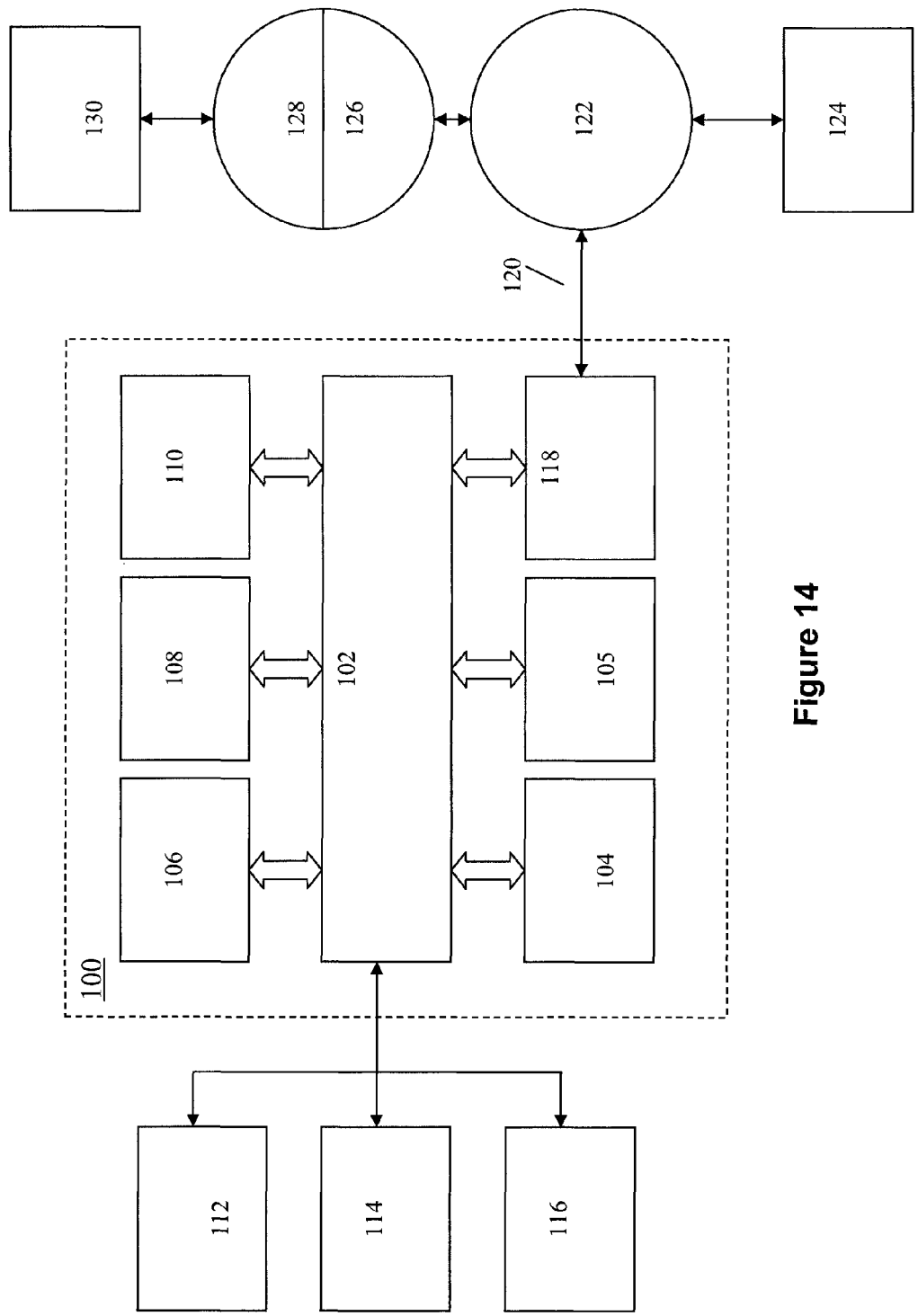
FIG. 14 is a block diagram that illustrates a computer system which can assist in the implementation of the simulation method of the present invention.

Details of a Computer System for Implementing the Embodiments of the Present Invention FIG. 14 is a block diagram that illustrates a computer system 100 which can assist and/or implement the SGM-optimization methods for lithographic simulation disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 15:
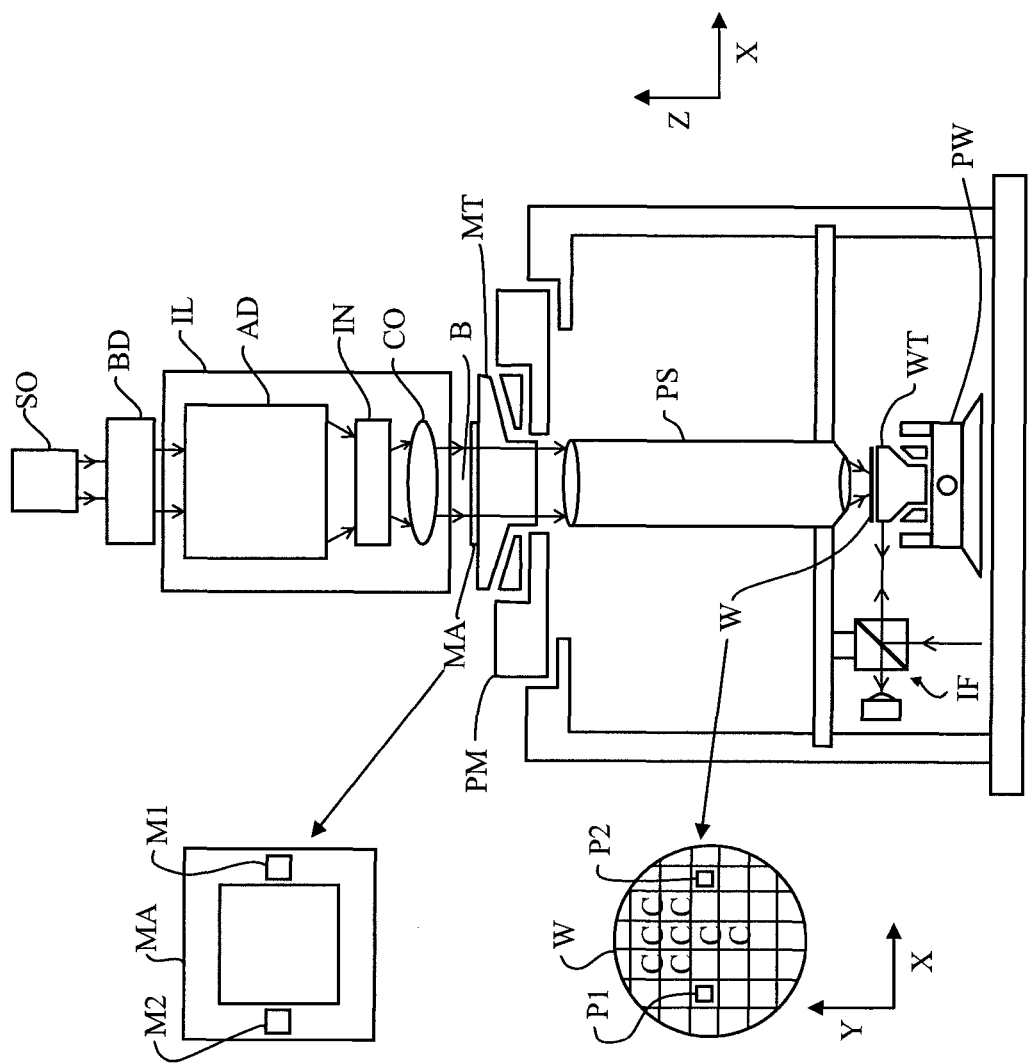
FIG. 15 schematically depicts a lithographic projection apparatus suitable for use with the method of the present invention.

FIG. 15 schematically depicts an exemplary lithographic projection apparatus for which lithographic processing can be simulated utilizing the process of present invention. The apparatus comprises:

- a radiation system Ex, IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

The invention may be further described using the following clauses:

1. A method for enhancing signal strength for placing sub-resolution assist features ("SRAF") with respect to one or more target patterns in a mask layout, comprising:
   generating an initial SRAF guidance map for the mask layout;
   placing a first set of one or more SRAF in the mask layout according to the initial SRAF guidance map;
   altering one or more of number, location and dimension of at least a portion of the first set of one or more SRAFs;
   measuring improvement in signal strength in the initial SRAF guidance map; and
   generating an updated SRAF guidance map with enhanced signal strength.

2. The method of clause 1, wherein the method further comprises:
   placing a subsequent set of one or more SRAF in the mask layout according to the updated SRAF guidance map.

3. The method of clause 2, wherein the method further comprises:
   repeating the steps of generating an updated SRAF guidance map and placing the subsequent set of one or more SRAF in an iterative process, until a predefined lithographic process window criterion is satisfied.

4. The method of clause 3, wherein the step of iteratively placing a subsequent set of one or more SRAF comprises:
   replacing a prior set of one or more SRAF with a completely new subsequent set of one or more SRAF.

5. The method of clause 3, wherein the step of iteratively placing a subsequent set of one or more SRAF comprises:
   retaining at least portions of a prior set of one or more SRAF; and
   adjusting the prior set of one or more SRAF to obtain the subsequent set of one or more SRAF.

6. The method of clause 1, wherein the method further comprises:
   applying optical proximity corrections (OPC) to original target patterns in the mask layout to generate a corrected mask layout.

7. The method of clause 3, wherein the iterative process comprises:
   using a prior set of one or more SRAF and a prior corrected mask layout to generate an updated SRAF guidance map;
   using the updated SRAF guidance map to generate a subsequent set of one or more SRAF;
   applying OPC to the prior corrected mask layout to generate a subsequent corrected mask layout that includes the subsequent set of one or more SRAF; and
   using the subsequent corrected mask layout to determine whether the predefined lithographic process window criterion is satisfied.

8. The method of clause 3, wherein the iterative process comprises:
   using a prior set of one or more SRAF and original target patterns to generate an updated SRAF guidance map;
   using the updated SRAF guidance map to generate a subsequent set of one or more SRAF;
   generating a subsequent mask layout that includes the subsequent set of one or more SRAF; and
   using the subsequent mask layout to determine whether the predefined lithographic process window criterion is satisfied.

9. The method of clause 1, further comprising generating SRAF placement rules using the SRAF guidance map.

10. The method of clause 1, wherein the mask layout includes a predefined mask bias.

11. The method of clause 3, wherein the process window comprises one or more of a focus window, and an exposure dose window.

12. The method of clause 3, wherein the iterative process is terminated when a predefined cost function representing a lithographic response reaches an optimum value that is associated with the predefined process window criterion.

13. The method of clause 12, wherein the predefined cost function represents an image log slope (ILS), an edge placement error, a mask error enhancement factor, or a combination thereof.

14. A computer program product comprising a computer-readable medium having instructions recorded therein, which when executed, cause the computer to generate files corresponding to a mask layout having a plurality of target patterns to be imaged in a lithographic imaging process, the generation of the files comprising the steps of:
  generating an initial SRAF guidance map for the mask layout;
  placing a first set of one or more SRAF in the mask layout according to the initial SRAF guidance map;
  generating an updated SRAF guidance map using the first set of one or more SRAF and the plurality of target patterns;
  placing a subsequent set of one or more SRAF in the mask layout according to the updated SRAF guidance map; and
  repeating the steps of generating an updated SRAF guidance map and placing the subsequent set of one or more SRAF in an iterative process, until a predefined lithographic process window criterion is satisfied.

15. The computer program product of clause 14, wherein the method further comprises:
  applying optical proximity corrections (OPC) to original target patterns in the mask layout to generate a corrected mask layout.

16. The computer program product of clause 15, wherein the iterative process comprises:
  using a prior set of one or more SRAF and a prior corrected mask layout to generate an updated SRAF guidance map;
  using the updated SRAF guidance map to generate a subsequent set of one or more SRAF;
  applying OPC to the prior corrected mask layout to generate a subsequent corrected mask layout that includes the subsequent set of one or more SRAF; and
  using the subsequent corrected mask layout to determine whether the predefined lithographic process window criterion is satisfied.

17. The computer program product of clause 14, wherein the iterative process comprises:
  using a prior set of one or more SRAF and original target patterns to generate an updated SRAF guidance map;
  using the updated SRAF guidance map to generate a subsequent set of one or more SRAF;
  generating a subsequent mask layout that includes the subsequent set of one or more SRAF; and
  using the subsequent mask layout to determine whether the predefined lithographic process window criterion is satisfied.

18. The computer program product of clause 14, further comprising generating SRAF placement rules using the SRAF guidance map.

19. The computer program product of clause 14, wherein the mask layout includes a predefined mask bias.

20. The computer program product of clause 14, wherein the process window comprises one or more of a focus window, and an exposure dose window.

21. The computer program product of clause 14, wherein the iterative process is terminated when a predefined cost function representing a lithographic response reaches an optimum value that is associated with the predefined process window criterion.

22. The computer program product of clause 21, wherein the predefined cost function represents an image log slope (ILS), an edge placement error, a mask error enhancement factor, or a combination thereof.

23. The computer program product of clause 14, wherein the step of iteratively generating an updated SRAF guidance map comprises:
  altering one or more of number, location and dimension of at least a portion of a prior set of one or more SRAFs; and
  measuring improvement in signal strength to update a prior SRAF guidance map.

While specific embodiments of the invention have been described above, it will be appreciated that the invention may be practiced otherwise than as described.

The descriptions above are intended to be illustrative, not limiting, Thus, it will be apparent to those skilled in the art that modifications may be made to the invention as described without departing from the scope of the claims set out below.

What is claimed is:

1. A method implemented by a computer for placing sub-resolution assist features ("SRAF") with respect to one or more target patterns in an original mask layout, comprising:
  generating an initial SRAF guidance map for the original mask layout;
  generating a first set of one or more SRAFs according to the initial SRAF guidance map;
  generating a first altered mask layout corresponding to the original mask layout by placing the first set of one or more SRAFs in the original mask layout;
  determining, by the computer, a lithographic response for the first altered mask layout as a function of one or more process window parameters; and
  determining whether the lithographic response for the first altered mask layout accommodates a predefined process window size.

2. The method of claim 1, wherein the method further comprises:
  generating an updated SRAF guidance map using the first altered mask layout;
  generating a subsequent set of one or more SRAFs having enhanced signal strength according to the updated SRAF guidance map; and
  generating a subsequent altered mask layout by placing the subsequent set of one or more SRAFs in the original mask layout according to the updated SRAF guidance map.

3. The method of claim 2, wherein the method further comprises:
  repeating the steps of generating an updated SRAF guidance map, generating the subsequent altered mask layout, and determining the lithographic response for the subsequent altered mask layout in an iterative process, until the predefined process window size is accommodated.

4. The method of claim 3, wherein the step of iteratively placing a subsequent set of one or more SRAF comprises:
  replacing a prior set of one or more SRAF with a completely new subsequent set of one or more SRAF.

5. The method of claim 3, wherein the step of iteratively placing a subsequent set of one or more SRAF comprises:
  retaining at least portions of a prior set of one or more SRAF; and
  adjusting the prior set of one or more SRAF to obtain the subsequent set of one or more SRAF.

6. The method of claim 5, wherein adjusting the prior set includes altering one or more of number, location and dimension of the prior set of one or more SRAFs.

7. The method of claim 3, wherein the iterative process comprises:
applying OPC to the subsequent altered mask layout to generate a subsequent corrected mask layout that includes the subsequent set of one or more SRAF; and
using the subsequent corrected mask layout to determine whether the predefined process window size is accommodated.

8. The method of claim 3, wherein the predefined process window size comprises one or more of a focus window size, and an exposure dose window size.

9. The method of claim 3, wherein the iterative process is terminated when a predefined cost function representing the lithographic response reaches an optimum value that is associated with the predefined process window size.

10. The method of claim 1, wherein the method further comprises:
applying optical proximity corrections (OPC) to original target patterns in the mask layout to generate a corrected mask layout.

11. The method of claim 1, further comprising generating SRAF placement rules using the SRAF guidance map.

12. The method of claim 1, wherein the mask layout includes a predefined mask bias.

13. The method of claim 1, wherein the lithographic response is one or more of an image log slope (ILS), an edge placement error, and a mask error enhancement factor.

14. The method of claim 1, further comprising:
measuring improvement in signal strength in the initial SRAF guidance map; and
generating an updated SRAF guidance map with enhanced signal strength.

15. A computer program product comprising a non-transitory computer-readable medium having instructions recorded thereon, which when executed, cause the computer to perform a method for placing sub-resolution assist features ("SRAF") with respect to one or more target patterns in a an original mask layout, the method comprising:
generating an initial SRAF guidance map for the original mask layout;
generating a first set of one or more SRAFs according to the initial SRAF guidance map;
generating a first altered mask layout corresponding to the original mask layout by placing the first set of one or more SRAFs in the original mask layout;
determining, by the computer, a lithographic response for the first altered mask layout as a function of one or more process window parameters; and
determining whether the lithographic response for the first altered mask layout accommodates a predefined process window size.

* * * * *